United States Patent
Whitmire et al.

(10) Patent No.: US 10,015,898 B2
(45) Date of Patent: Jul. 3, 2018

(54) MODULAR GARAGE DOOR OPENER

(71) Applicants: TTI (MACAO COMMERCIAL OFFSHORE) LIMITED, Macau (MO); Susan L. McCracken, Anderson, SC (US)

(72) Inventors: J. Porter Whitmire, Greenville, SC (US); Todd Zimmerman, Simpsonville, SC (US); Mark Huggins, Anderson, SC (US); Michael Preus, Greenville, SC (US); Parke Pleasants, Anderson, SC (US); J. Luke Jenkins, Anderson, SC (US); Robert E. McCracken, Anderson, SC (US); Kenneth M. Brazell, Piedmont, SC (US); Taku Ohi, Greer, SC (US); C. Eric Lagman, Anderson, SC (US)

(73) Assignee: TTI (MACAO COMMERCIAL OFFSHORE) LIMITED, Macau (MO)

( * ) Notice: Subject to any disclaimer, the term of this patent is extended or adjusted under 35 U.S.C. 154(b) by 0 days.

(21) Appl. No.: 15/461,971

(22) Filed: Mar. 17, 2017

(65) Prior Publication Data

US 2017/0295658 A1    Oct. 12, 2017

Related U.S. Application Data

(60) Provisional application No. 62/321,176, filed on Apr. 11, 2016.

(51) Int. Cl.
*H05K 5/02* (2006.01)
*E05F 15/60* (2015.01)
(Continued)

(52) U.S. Cl.
CPC ........... *H05K 5/0221* (2013.01); *E05F 15/43* (2015.01); *E05F 15/60* (2015.01); *E05F 15/668* (2015.01);
(Continued)

(58) Field of Classification Search
CPC .............. H05K 5/0221; H05K 5/0247; G07C 9/00896; E05F 15/60
(Continued)

(56) References Cited

U.S. PATENT DOCUMENTS

| | | |
|---|---|---|
| 1,557,856 A | 10/1925 | Luebbing |
| 1,682,655 A | 8/1928 | Armour |

(Continued)

FOREIGN PATENT DOCUMENTS

| | | |
|---|---|---|
| CA | 2589760 | 9/1999 |
| CA | 2590140 | 9/1999 |

(Continued)

OTHER PUBLICATIONS

Doorking Inc., "Models 6050 and 6100 Vehicular Swing Gate Operator's Owner Manual," 2000 (53 pages).
(Continued)

*Primary Examiner* — Allen T Cao
(74) *Attorney, Agent, or Firm* — Michael Best & Friedrich LLP

(57) ABSTRACT

A modular garage door opener system and method including a garage door opener having a motor that is configured to be coupled to a garage door to open and close the garage door. The garage door opener includes a first accessory port including a first accessory mounting interface and a second accessory port disposed on the garage door opener including a second accessory mounting interface. An accessory device including a first mounting interface engages the first accessory mounting interface to couple the accessory device to
(Continued)

the first accessory port. The accessory device may be disengaged from the first accessory mounting interface and then engage the second accessory mounting interface to couple the accessory device to the second accessory port. Additionally, a second accessory device may engage the first accessory port after disengagement of the accessory device.

22 Claims, 18 Drawing Sheets

(51) Int. Cl.
   *G07C 9/00* (2006.01)
   *E05F 15/43* (2015.01)
   *E05F 15/668* (2015.01)
   *E05F 15/681* (2015.01)

(52) U.S. Cl.
   CPC ........ *E05F 15/681* (2015.01); *G07C 9/00896* (2013.01); *H05K 5/0247* (2013.01); *E05F 2015/435* (2015.01); *E05F 2015/436* (2015.01); *E05Y 2201/214* (2013.01); *E05Y 2400/61* (2013.01); *E05Y 2400/612* (2013.01); *E05Y 2400/614* (2013.01); *E05Y 2800/106* (2013.01); *E05Y 2800/20* (2013.01); *E05Y 2900/106* (2013.01); *G07C 2009/00928* (2013.01)

(58) Field of Classification Search
   USPC .................................................. 340/5.7–5.74
   See application file for complete search history.

(56) References Cited

U.S. PATENT DOCUMENTS

| | | |
|---|---|---|
| 2,096,839 A | 10/1937 | Barlow |
| 2,184,654 A | 12/1939 | Small |
| 2,585,773 A | 2/1952 | Hartman |
| 2,689,726 A | 9/1954 | Purdy |
| 3,254,450 A | 6/1966 | Schneider |
| 3,780,949 A | 12/1973 | Gavin |
| 3,996,957 A | 12/1976 | Goldish et al. |
| 4,064,404 A | 12/1977 | Willmott et al. |
| 4,338,526 A * | 7/1982 | Martin .................... E05F 15/72 307/116 |
| 4,360,801 A | 11/1982 | Duhame |
| 4,366,482 A | 12/1982 | Remes et al. |
| 4,433,274 A | 2/1984 | Duhame |
| 4,464,651 A | 8/1984 | Duhame |
| 4,538,661 A | 9/1985 | Henry |
| 4,665,378 A | 5/1987 | Heckethorn |
| 4,738,052 A | 4/1988 | Yoshida |
| 4,750,295 A | 6/1988 | Court et al. |
| 4,801,250 A | 1/1989 | Lammers |
| D300,036 S | 2/1989 | Mariol |
| 4,809,633 A | 3/1989 | Santos |
| 4,835,410 A | 5/1989 | Bhagwat et al. |
| 4,840,212 A | 6/1989 | Wei |
| 4,847,542 A | 7/1989 | Clark et al. |
| D303,394 S | 9/1989 | Mariol |
| 4,904,880 A | 2/1990 | Yoshida |
| 4,915,594 A | 4/1990 | Lammers |
| 4,946,096 A | 8/1990 | Ballard et al. |
| RE33,898 E | 4/1992 | Santos |
| 5,144,153 A | 9/1992 | Scheppmann, II |
| 5,168,911 A | 12/1992 | Gottschalk |
| D334,269 S | 3/1993 | Jones et al. |
| 5,205,793 A | 4/1993 | Jones |
| D340,724 S | 10/1993 | Mariol |
| 5,281,782 A | 1/1994 | Conatser |
| 5,282,337 A | 2/1994 | Duhame et al. |
| 5,349,980 A | 9/1994 | Spiegel |
| 5,369,913 A | 12/1994 | Brickner |
| 5,576,739 A | 11/1996 | Murphy |
| 5,589,747 A | 12/1996 | Utke |
| 5,603,416 A | 2/1997 | Richardson et al. |
| 5,609,300 A | 3/1997 | Conatser |
| 5,639,219 A | 6/1997 | Conatser |
| 5,687,897 A | 11/1997 | Fa et al. |
| 5,699,967 A | 12/1997 | Conatser et al. |
| 5,752,343 A | 5/1998 | Quintus |
| 5,780,734 A | 7/1998 | Johnson |
| 5,781,107 A | 7/1998 | Ji |
| 5,785,228 A | 7/1998 | Fa et al. |
| 5,829,492 A | 11/1998 | Gavronsky et al. |
| 5,832,974 A | 11/1998 | Jou |
| 5,836,639 A | 11/1998 | Kleefeldt et al. |
| D401,944 S | 12/1998 | Campbell |
| D402,997 S | 12/1998 | Campbell et al. |
| 5,844,328 A | 12/1998 | Furst |
| 5,867,005 A | 2/1999 | Brown |
| 5,947,814 A | 9/1999 | Czeck et al. |
| 5,969,637 A | 10/1999 | Doppelt et al. |
| 6,002,346 A | 12/1999 | Bowden et al. |
| 6,014,307 A | 1/2000 | Crimmins |
| 6,019,084 A | 2/2000 | Haynes et al. |
| 6,020,703 A | 2/2000 | Telmet |
| 6,027,148 A | 2/2000 | Shoemaker |
| 6,036,109 A | 3/2000 | DeYoung |
| 6,036,595 A | 3/2000 | Vole |
| D422,603 S | 4/2000 | DeYoung |
| 6,049,598 A | 4/2000 | Peter et al. |
| 6,051,947 A | 4/2000 | Lhotak et al. |
| 6,068,203 A | 5/2000 | DeYoung et al. |
| D427,282 S | 6/2000 | Bower et al. |
| D427,283 S | 6/2000 | Bower et al. |
| 6,070,361 A | 6/2000 | Paterno |
| D428,470 S | 7/2000 | Bower et al. |
| 6,084,358 A | 7/2000 | Dolson |
| 6,089,626 A | 7/2000 | Shoemaker |
| D429,313 S | 8/2000 | Bower et al. |
| D429,314 S | 8/2000 | Bower et al. |
| 6,102,667 A | 8/2000 | Johnson |
| 6,124,822 A | 9/2000 | Wu |
| D432,138 S | 10/2000 | Scarth et al. |
| 6,133,703 A | 10/2000 | Fitzgibbon et al. |
| D434,048 S | 11/2000 | Orschell et al. |
| 6,154,150 A | 11/2000 | Laubach |
| 6,166,634 A | 12/2000 | Dean |
| 6,181,095 B1 | 1/2001 | Telmet |
| 6,183,224 B1 | 2/2001 | Conatser |
| 6,184,787 B1 | 2/2001 | Morris |
| 6,191,706 B1 | 2/2001 | Kositkun |
| D439,819 S | 4/2001 | Bass et al. |
| 6,218,962 B1 | 4/2001 | Fiene |
| D441,561 S | 5/2001 | Stoppenhagen et al. |
| D441,628 S | 5/2001 | Bass et al. |
| 6,227,815 B1 | 5/2001 | Chandra et al. |
| 6,229,276 B1 | 5/2001 | Fitzgibbon et al. |
| D444,365 S | 7/2001 | Bass et al. |
| D446,043 S | 8/2001 | Stoppenhagen et al. |
| D446,433 S | 8/2001 | Bass et al. |
| 6,310,548 B1 | 10/2001 | Stephens, Jr. |
| 6,328,223 B1 | 12/2001 | Holt et al. |
| 6,346,889 B1 | 2/2002 | Moss |
| 6,357,338 B2 | 3/2002 | Montgomery |
| 6,375,430 B1 | 4/2002 | Eckert et al. |
| 6,386,833 B1 | 5/2002 | Montgomery |
| 6,386,969 B1 | 5/2002 | O'Brien |
| 6,431,839 B2 | 8/2002 | Gruber et al. |
| 6,435,076 B2 | 8/2002 | Montgomery |
| 6,443,715 B1 | 9/2002 | Mayleben et al. |
| 6,447,257 B2 | 9/2002 | Orschell |
| D464,471 S | 10/2002 | Burdsall et al. |
| D464,547 S | 10/2002 | Bass et al. |
| 6,460,626 B2 | 10/2002 | Carrier |
| 6,462,660 B1 | 10/2002 | Cannon et al. |
| 6,464,531 B2 | 10/2002 | Eckert et al. |
| 6,469,464 B1 | 10/2002 | McCall |
| D465,981 S | 11/2002 | Bass et al. |
| 6,484,784 B1 | 11/2002 | Weik, III et al. |
| D469,672 S | 2/2003 | Bass et al. |

(56) References Cited

U.S. PATENT DOCUMENTS

| | | |
|---|---|---|
| 6,522,258 B1 | 2/2003 | Lott |
| 6,524,181 B2 | 2/2003 | Wasson |
| 6,531,966 B2 | 3/2003 | Krieger |
| 6,561,063 B1 | 5/2003 | Mulford et al. |
| 6,561,233 B2 | 5/2003 | Weems et al. |
| 6,563,278 B2 | 5/2003 | Roman |
| 6,563,431 B1 | 5/2003 | Miller, Jr. |
| D475,721 S | 6/2003 | Harper et al. |
| D476,061 S | 6/2003 | Neal |
| D477,384 S | 7/2003 | Williams et al. |
| D478,094 S | 8/2003 | Scarth et al. |
| D478,095 S | 8/2003 | Reger |
| D478,964 S | 8/2003 | Williams et al. |
| 6,624,605 B1 | 9/2003 | Powder et al. |
| 6,626,380 B1 | 9/2003 | Williams et al. |
| D482,699 S | 11/2003 | Graf et al. |
| 6,649,839 B2 | 11/2003 | Eckert et al. |
| D484,571 S | 12/2003 | Neal |
| 6,669,114 B1 | 12/2003 | Williams et al. |
| 6,670,725 B2 | 12/2003 | Fitzgibbon et al. |
| D485,282 S | 1/2004 | Scarth et al. |
| 6,676,382 B2 | 1/2004 | Leighton et al. |
| 6,683,431 B2 | 1/2004 | Fitzgibbon |
| 6,701,975 B1 | 3/2004 | Neal |
| D488,082 S | 4/2004 | Durr et al. |
| D489,736 S | 5/2004 | Harper et al. |
| 6,752,433 B2 | 6/2004 | Frost |
| D495,717 S | 9/2004 | Harper et al. |
| 6,789,581 B2 | 9/2004 | Cowan et al. |
| D497,917 S | 11/2004 | Harper et al. |
| 6,819,071 B2 | 11/2004 | Graham et al. |
| D499,744 S | 12/2004 | Orschell et al. |
| D500,331 S | 12/2004 | Crisler, III et al. |
| D500,332 S | 12/2004 | Crisler, III et al. |
| D501,146 S | 1/2005 | Durr et al. |
| 6,853,313 B2 | 2/2005 | Newcomer |
| 6,860,065 B2 | 3/2005 | Griffin et al. |
| D503,898 S | 4/2005 | Durr et al. |
| 6,878,889 B1 | 4/2005 | Horst et al. |
| D504,903 S | 5/2005 | Crisler, III et al. |
| D505,088 S | 5/2005 | Durr et al. |
| 6,894,613 B2 | 5/2005 | Stab |
| 6,897,406 B2 | 5/2005 | Crisler, III et al. |
| D505,872 S | 6/2005 | Durr et al. |
| 6,911,898 B2 | 6/2005 | Chung |
| D507,279 S | 7/2005 | Harper et al. |
| 6,918,291 B2 | 7/2005 | Durr et al. |
| 6,920,718 B2 | 7/2005 | Hom et al. |
| D508,930 S | 8/2005 | Crisler, III et al. |
| 6,946,973 B1 | 9/2005 | Yanda |
| D512,618 S | 12/2005 | Bass et al. |
| 6,975,203 B2 | 12/2005 | Brookbank |
| 6,982,652 B2 | 1/2006 | Laird et al. |
| 6,989,760 B2 | 1/2006 | Dierking |
| D514,412 S | 2/2006 | Lawrence et al. |
| 6,998,977 B2 | 2/2006 | Gregori et al. |
| 7,000,251 B2 | 2/2006 | DeYoung |
| 7,002,312 B2 | 2/2006 | Wojciak, Jr. |
| 7,005,994 B2 | 2/2006 | King |
| D517,934 S | 3/2006 | Durr et al. |
| 7,015,790 B1 | 3/2006 | Schrott et al. |
| 7,016,899 B1 | 3/2006 | Stern et al. |
| 7,017,887 B1 | 3/2006 | Verakis |
| D519,693 S | 4/2006 | Ricker et al. |
| D520,687 S | 5/2006 | Ricker et al. |
| D521,694 S | 5/2006 | Ricker et al. |
| 7,040,355 B2 | 5/2006 | Wu |
| 7,042,492 B2 | 5/2006 | Spinelli |
| 7,047,087 B2 | 5/2006 | Hantke et al. |
| 7,049,980 B1 | 5/2006 | Chemelewski |
| 7,057,547 B2 | 6/2006 | Olmsted |
| 7,066,406 B2 | 6/2006 | Williams et al. |
| D524,999 S | 7/2006 | Ray |
| D525,432 S | 7/2006 | Feldmann et al. |
| D526,781 S | 8/2006 | Feldmann et al. |
| D528,297 S | 9/2006 | Feldmann et al. |
| 7,119,681 B2 | 10/2006 | Eskildsen |
| 7,126,084 B2 | 10/2006 | DeYoung |
| 7,140,179 B2 | 11/2006 | Bass et al. |
| 7,140,598 B2 | 11/2006 | Verakis et al. |
| 7,145,470 B2 * | 12/2006 | Hoermann ............ F21V 33/006 318/266 |
| 7,153,418 B2 | 12/2006 | Mauro, Sr. et al. |
| D534,698 S | 1/2007 | Ray |
| D536,007 S | 1/2007 | Bass et al. |
| 7,161,319 B2 | 1/2007 | Ergun et al. |
| 7,161,498 B1 | 1/2007 | Fan |
| D536,348 S | 2/2007 | Bass |
| D536,707 S | 2/2007 | Bass et al. |
| D536,708 S | 2/2007 | Bass |
| 7,176,656 B2 | 2/2007 | Feldmann |
| 7,183,933 B2 | 2/2007 | Dzurko et al. |
| 7,194,412 B2 | 3/2007 | Mays |
| 7,207,142 B2 | 4/2007 | Mullet |
| 7,207,174 B2 | 4/2007 | Montgomery et al. |
| 7,208,897 B2 | 4/2007 | Hotto et al. |
| D542,538 S | 5/2007 | Klein et al. |
| D543,361 S | 5/2007 | Klein et al. |
| 7,262,572 B2 | 8/2007 | Fitzgibbon |
| 7,265,508 B1 | 9/2007 | Karasek |
| 7,270,142 B2 | 9/2007 | Acosta |
| D557,898 S | 12/2007 | Feldmann et al. |
| 7,302,775 B2 | 12/2007 | Olmsted |
| 7,320,345 B2 | 1/2008 | Matthews et al. |
| 7,337,016 B2 | 2/2008 | Hantke et al. |
| 7,342,368 B2 | 3/2008 | Roman |
| 7,345,574 B2 | 3/2008 | Fitzgibbon |
| 7,382,063 B2 | 6/2008 | Mullet et al. |
| 7,431,346 B2 | 10/2008 | Frost et al. |
| D580,514 S | 11/2008 | Bass et al. |
| D581,483 S | 11/2008 | Bass et al. |
| 7,468,676 B2 | 12/2008 | Styers et al. |
| 7,498,936 B2 | 3/2009 | Maeng |
| 7,515,063 B2 | 4/2009 | Brundula |
| 7,518,326 B2 | 4/2009 | Shier et al. |
| 7,532,709 B2 | 5/2009 | Styers et al. |
| 7,537,027 B2 | 5/2009 | Bass et al. |
| 7,556,478 B2 | 7/2009 | Klein et al. |
| D601,173 S | 9/2009 | Wilmes et al. |
| 7,602,283 B2 | 10/2009 | John |
| D604,200 S | 11/2009 | Fassold et al. |
| D605,919 S | 12/2009 | Schneider et al. |
| D605,920 S | 12/2009 | Schneider et al. |
| 7,635,966 B2 | 12/2009 | Butler |
| D611,962 S | 3/2010 | Schneider et al. |
| 7,677,476 B2 | 3/2010 | Burdsall et al. |
| 7,683,794 B2 | 3/2010 | Contreras |
| 7,688,014 B2 | 3/2010 | Tang |
| 7,710,284 B2 | 5/2010 | Dzurko et al. |
| D620,500 S | 7/2010 | Brandt et al. |
| D622,739 S | 8/2010 | Bass et al. |
| 7,786,619 B2 | 8/2010 | Crusius et al. |
| 7,812,742 B2 | 10/2010 | Pankowski |
| 7,813,114 B2 | 10/2010 | Stewart et al. |
| 7,840,186 B2 | 11/2010 | Franson |
| 7,869,582 B2 | 1/2011 | Styers et al. |
| 7,873,279 B2 | 1/2011 | Alameh et al. |
| 7,912,508 B2 | 3/2011 | Lee et al. |
| 7,913,889 B2 | 3/2011 | Lawrence |
| D636,409 S | 4/2011 | Wilmes et al. |
| D636,792 S | 4/2011 | Parks et al. |
| D637,211 S | 5/2011 | Parks et al. |
| 7,940,300 B2 | 5/2011 | Spinelli |
| 7,974,536 B2 | 7/2011 | Yu et al. |
| 7,983,451 B2 | 7/2011 | Super et al. |
| 7,996,231 B2 | 8/2011 | Mays |
| 8,004,555 B2 | 8/2011 | Oswald et al. |
| 8,007,110 B2 | 8/2011 | Dunn et al. |
| 8,015,997 B2 | 9/2011 | Bass et al. |
| 8,026,946 B2 | 9/2011 | Nassimi |
| 8,030,796 B2 | 10/2011 | Fitzgibbon et al. |
| 8,058,841 B2 | 11/2011 | Chander et al. |
| 8,059,897 B2 | 11/2011 | Xu et al. |
| 8,061,573 B2 | 11/2011 | Kramer |

(56) References Cited

U.S. PATENT DOCUMENTS

| | | |
|---|---|---|
| 8,063,592 B2 | 11/2011 | Shier et al. |
| 8,066,205 B2 | 11/2011 | Bass et al. |
| 8,068,879 B2 | 11/2011 | Bodas et al. |
| 8,077,054 B1 | 12/2011 | Aarons |
| 8,095,191 B2 | 1/2012 | Gorsica et al. |
| 8,103,118 B2 | 1/2012 | Foo et al. |
| 8,111,133 B2 | 2/2012 | Rodriguez et al. |
| 8,132,929 B2 | 3/2012 | Harton et al. |
| 8,162,486 B2 | 4/2012 | Borger et al. |
| 8,174,274 B2 | 5/2012 | Lawrence et al. |
| 8,179,473 B2 | 5/2012 | Harmon et al. |
| 8,218,739 B2 | 7/2012 | Styers et al. |
| 8,223,217 B2 | 7/2012 | Shurboff et al. |
| 8,223,235 B2 | 7/2012 | John |
| 8,224,303 B2 | 7/2012 | White |
| 8,231,247 B2 | 7/2012 | Olmsted |
| 8,237,383 B2 | 8/2012 | Shier et al. |
| 8,237,769 B2 | 8/2012 | Crenshaw et al. |
| 8,267,666 B2 | 9/2012 | Gruber et al. |
| 8,300,079 B2 | 10/2012 | Tian |
| 8,319,751 B2 | 11/2012 | Challener et al. |
| 8,325,040 B2 | 12/2012 | Nassimi |
| 8,330,570 B2 | 12/2012 | Martin |
| 8,330,573 B2 | 12/2012 | Crucs |
| 8,373,555 B1 | 2/2013 | Redden et al. |
| 8,373,742 B2 | 2/2013 | Wheatley et al. |
| 8,375,913 B2 | 2/2013 | Kwiecinski et al. |
| 8,387,649 B2 | 3/2013 | Parks et al. |
| 8,410,930 B2 | 4/2013 | Karasek et al. |
| 8,419,379 B2 | 4/2013 | Bass et al. |
| 8,430,184 B2 | 4/2013 | Bass et al. |
| 8,433,076 B2 | 4/2013 | Zurek et al. |
| D682,651 S | 5/2013 | McRoberts et al. |
| D682,652 S | 5/2013 | McRoberts et al. |
| 8,446,389 B2 | 5/2013 | Challener et al. |
| 8,466,808 B2 | 6/2013 | Ghatak |
| 8,494,224 B2 | 7/2013 | Super et al. |
| 8,494,861 B2 | 7/2013 | Robb et al. |
| 8,503,712 B2 | 8/2013 | Ahmed et al. |
| 8,504,574 B2 | 8/2013 | Dvorak et al. |
| 8,542,093 B2 | 9/2013 | Rodriguez |
| 8,558,885 B2 | 10/2013 | Fitzgibbon |
| 8,564,619 B2 | 10/2013 | Alberth, Jr. et al. |
| 8,576,179 B2 | 11/2013 | Walliser et al. |
| 8,576,372 B2 | 11/2013 | Ji et al. |
| 8,584,401 B2 | 11/2013 | Planck et al. |
| 8,589,968 B2 | 11/2013 | Alberth et al. |
| 8,593,471 B2 | 11/2013 | Huang et al. |
| 8,595,360 B2 | 11/2013 | Hill et al. |
| 8,637,781 B2 | 1/2014 | Derengowski et al. |
| 8,638,951 B2 | 1/2014 | Zurek et al. |
| 8,643,467 B2 | 2/2014 | Chutorash et al. |
| 8,653,962 B2 | 2/2014 | Maeng |
| 8,682,388 B2 | 3/2014 | Vuppu et al. |
| 8,692,943 B2 | 4/2014 | Tsuchihashi et al. |
| 8,717,443 B2 | 5/2014 | Kaehler et al. |
| 8,726,324 B2 | 5/2014 | Tirpak et al. |
| 8,730,342 B2 | 5/2014 | Shurboff et al. |
| 8,760,406 B2 | 6/2014 | Herrmann et al. |
| 8,761,401 B2 | 6/2014 | Sprunk et al. |
| 8,761,815 B2 | 6/2014 | Xu et al. |
| 8,766,119 B2 | 7/2014 | Cotha et al. |
| 8,766,768 B2 | 7/2014 | Martin |
| 8,786,435 B2 | 7/2014 | Barnett |
| 8,786,759 B2 | 7/2014 | Wang et al. |
| 8,788,676 B2 | 7/2014 | Alameh et al. |
| 8,797,274 B2 | 8/2014 | Challener et al. |
| 8,798,671 B2 | 8/2014 | Grubb |
| 8,810,433 B1 | 8/2014 | Aarons |
| 8,810,434 B2 | 8/2014 | Aarons |
| 8,817,951 B2 | 8/2014 | Goffin et al. |
| 8,818,461 B2 | 8/2014 | Cybart et al. |
| 8,841,988 B2 | 9/2014 | Summerford et al. |
| 8,842,885 B2 | 9/2014 | Wang et al. |
| 8,844,840 B2 | 9/2014 | Lawrence |
| 8,866,583 B2 | 10/2014 | Ordaz |
| 8,878,646 B2 | 11/2014 | Chutorash et al. |
| 8,890,823 B2 | 11/2014 | Alameh et al. |
| 8,896,533 B2 | 11/2014 | Sonada et al. |
| 8,896,753 B2 | 11/2014 | Oozeki et al. |
| 8,897,033 B2 | 11/2014 | Slipy et al. |
| 8,908,880 B2 | 12/2014 | Zurek et al. |
| 8,922,696 B2 | 12/2014 | Shibata et al. |
| 8,933,877 B2 | 1/2015 | Alameh |
| 8,941,745 B2 | 1/2015 | Tajima |
| 8,953,082 B2 | 2/2015 | Shimotono et al. |
| D724,923 S | 3/2015 | McRoberts et al. |
| 8,994,496 B2 | 3/2015 | Freese et al. |
| 9,009,158 B2 | 4/2015 | Tonegawa et al. |
| 9,024,958 B2 | 5/2015 | Nicholson et al. |
| 9,099,021 B2 | 8/2015 | Yu |
| 9,110,635 B2 | 8/2015 | Knox et al. |
| 9,122,254 B2 | 9/2015 | Cate et al. |
| 9,134,887 B2 | 9/2015 | Cudak et al. |
| 9,141,099 B2 | 9/2015 | Cate et al. |
| 9,141,234 B2 | 9/2015 | Nakamura et al. |
| 9,161,000 B2 | 10/2015 | Zhang et al. |
| 9,163,845 B1 | 10/2015 | Carlozzi |
| 9,169,684 B2 | 10/2015 | Fan et al. |
| 9,185,275 B2 | 11/2015 | Osborne et al. |
| 9,189,952 B2 | 11/2015 | Chutorash et al. |
| 9,196,948 B2 | 11/2015 | Yamamoto et al. |
| 9,197,760 B2 | 11/2015 | Karakaya et al. |
| 9,213,659 B2 | 12/2015 | Beaumont et al. |
| 9,230,378 B2 | 1/2016 | Chutorash et al. |
| 9,235,830 B1 | 1/2016 | VanBlon et al. |
| 9,261,713 B1 | 2/2016 | Weksler et al. |
| D750,461 S | 3/2016 | McRoberts et al. |
| 9,273,508 B2 | 3/2016 | Manaras |
| 9,277,175 B2 | 3/2016 | Sano |
| 9,284,771 B1 | 3/2016 | Doherty |
| 9,293,925 B2 | 3/2016 | Heng et al. |
| 9,297,464 B1 | 3/2016 | Wang |
| 9,304,591 B2 | 4/2016 | Cromer et al. |
| 9,310,886 B2 | 4/2016 | McKenna et al. |
| 9,328,834 B2 | 5/2016 | Wang |
| 9,333,945 B2 | 5/2016 | Lin |
| 9,351,271 B2 | 5/2016 | Yang et al. |
| 9,355,237 B2 | 5/2016 | Peterson et al. |
| 9,367,125 B2 | 6/2016 | Gao et al. |
| 9,376,851 B2 | 6/2016 | Cate et al. |
| 9,405,360 B2 | 8/2016 | Ang |
| 9,406,360 B2 | 8/2016 | Song |
| 9,458,657 B2 | 10/2016 | French et al. |
| 9,559,545 B2 | 1/2017 | Liu et al. |
| 9,600,950 B2 | 3/2017 | Chutorash et al. |
| 9,728,020 B2 | 8/2017 | Freese et al. |
| 2002/0014954 A1 | 2/2002 | Fitzgibbon et al. |
| 2002/0108671 A1 | 8/2002 | Campbell et al. |
| 2002/0140576 A1 | 10/2002 | Simon |
| 2002/0180600 A1 | 12/2002 | Kirkland et al. |
| 2002/0183008 A1 | 12/2002 | Menard et al. |
| 2003/0025470 A1 | 2/2003 | Fitzgibbon et al. |
| 2003/0063715 A1 | 4/2003 | Peplinski |
| 2003/0160705 A1 | 8/2003 | Guertz |
| 2004/0080424 A1 | 4/2004 | Perry et al. |
| 2004/0099853 A1 | 5/2004 | Verakis |
| 2004/0143766 A1 | 7/2004 | Fitzgibbon et al. |
| 2004/0194387 A1 | 10/2004 | Hom et al. |
| 2004/0212498 A1 | 10/2004 | Peterson et al. |
| 2004/0257236 A1 | 12/2004 | Klemish |
| 2005/0012631 A1 | 1/2005 | Gregori et al. |
| 2005/0057100 A1 | 3/2005 | Crusius et al. |
| 2005/0109748 A1 | 5/2005 | Albrecht et al. |
| 2005/0207616 A1 | 9/2005 | Brad et al. |
| 2005/0252613 A1 | 11/2005 | Evans |
| 2005/0269984 A1 | 12/2005 | Piechowiak et al. |
| 2006/0061313 A1 | 3/2006 | Fitzgibbon et al. |
| 2006/0108571 A1 | 5/2006 | Verakis et al. |
| 2006/0171453 A1 | 8/2006 | Rohlfing et al. |
| 2006/0179671 A1 | 8/2006 | Ghatak |
| 2006/0255931 A1 | 11/2006 | Hartsfield et al. |
| 2007/0033932 A1 | 2/2007 | Montgomery et al. |
| 2007/0189911 A1 | 8/2007 | Holt |

(56) References Cited

U.S. PATENT DOCUMENTS

| | | |
|---|---|---|
| 2007/0229218 A1 | 10/2007 | Nassimi |
| 2007/0229220 A1 | 10/2007 | Nassimi |
| 2007/0235149 A1 | 10/2007 | Hillar |
| 2007/0253849 A1 | 11/2007 | Holt |
| 2007/0269318 A1 | 11/2007 | Bass |
| 2008/0079570 A1 | 4/2008 | Fineman |
| 2009/0124189 A1 | 5/2009 | Barber |
| 2009/0229190 A1 | 9/2009 | Daniel-Wayman et al. |
| 2009/0230768 A1 | 9/2009 | Daniel-Wayman et al. |
| 2009/0231093 A1 | 9/2009 | Keller, Jr. et al. |
| 2009/0231121 A1 | 9/2009 | Daniel-Wayman et al. |
| 2009/0231427 A1 | 9/2009 | Fitzgibbon et al. |
| 2009/0231434 A1 | 9/2009 | Fitzgibbon et al. |
| 2009/0313898 A1 | 12/2009 | Manaras |
| 2010/0058669 A1 | 3/2010 | Cole |
| 2010/0108627 A1* | 5/2010 | Lupinacci ............ A47B 46/005 211/116 |
| 2010/0127882 A1 | 5/2010 | Sitarski |
| 2010/0156182 A1 | 6/2010 | Mertel et al. |
| 2010/0166404 A1 | 7/2010 | Lombardi |
| 2010/0245040 A1 | 9/2010 | Greves |
| 2010/0258631 A1 | 10/2010 | Rueblinger et al. |
| 2010/0271202 A1 | 10/2010 | Lin |
| 2010/0315510 A1 | 12/2010 | Dunn et al. |
| 2010/0328219 A1 | 12/2010 | Lombardi et al. |
| 2011/0063101 A1 | 3/2011 | Cristoforo |
| 2011/0199234 A1 | 8/2011 | Butler, III et al. |
| 2011/0273378 A1 | 11/2011 | Alameh et al. |
| 2011/0278759 A1 | 11/2011 | Sohn et al. |
| 2012/0036437 A1 | 2/2012 | Alberth, Jr. et al. |
| 2012/0133485 A1 | 5/2012 | Nassimi |
| 2012/0133527 A1 | 5/2012 | Lin |
| 2012/0138189 A1 | 6/2012 | Lunn |
| 2012/0188077 A1 | 7/2012 | Sawyer |
| 2012/0139701 A1 | 9/2012 | Crucs |
| 2012/0235785 A1 | 9/2012 | Alberth et al. |
| 2012/0242840 A1 | 9/2012 | Nakfour et al. |
| 2012/0258668 A1 | 10/2012 | Rokusek et al. |
| 2012/0260575 A1 | 10/2012 | Monaco |
| 2012/0327180 A1 | 12/2012 | Thorson et al. |
| 2013/0055641 A1 | 3/2013 | Chen |
| 2013/0063259 A1 | 3/2013 | Kramer et al. |
| 2013/0081329 A1 | 4/2013 | French |
| 2013/0152129 A1 | 6/2013 | Alberth et al. |
| 2013/0160036 A1 | 6/2013 | Narasimhan et al. |
| 2013/0190052 A1 | 7/2013 | Lundell |
| 2013/0202130 A1 | 8/2013 | Zurek et al. |
| 2013/0202132 A1 | 8/2013 | Zurek et al. |
| 2013/0222137 A1 | 8/2013 | Alameh et al. |
| 2013/0286232 A1 | 10/2013 | Sheh |
| 2013/0293670 A1 | 11/2013 | Ayoub et al. |
| 2013/0308835 A1 | 11/2013 | Thorson |
| 2013/0322568 A1 | 12/2013 | Pais et al. |
| 2014/0007505 A1 | 1/2014 | Manaras |
| 2014/0009461 A1 | 1/2014 | Dai et al. |
| 2014/0022108 A1 | 1/2014 | Alberth, Jr. et al. |
| 2014/0078660 A1 | 3/2014 | Dondzik et al. |
| 2014/0085492 A1 | 3/2014 | Petrescu |
| 2014/0115360 A1 | 4/2014 | Zhou et al. |
| 2014/0117757 A1 | 5/2014 | Tsui et al. |
| 2014/0118240 A1 | 5/2014 | Pais |
| 2014/0118354 A1 | 5/2014 | Pais et al. |
| 2014/0176387 A1 | 6/2014 | Coles et al. |
| 2014/0184854 A1 | 7/2014 | Musatenko |
| 2014/0198466 A1 | 7/2014 | Sawadski et al. |
| 2014/0208128 A1 | 7/2014 | Gyorfi et al. |
| 2014/0239781 A1 | 8/2014 | Allore et al. |
| 2014/0240464 A1 | 8/2014 | Lee |
| 2014/0240469 A1 | 8/2014 | Lee |
| 2014/0241614 A1 | 8/2014 | Lee |
| 2014/0259927 A1 | 9/2014 | McNally, II |
| 2014/0266593 A1 | 9/2014 | Nye et al. |
| 2014/0267716 A1 | 9/2014 | Child et al. |
| 2014/0268459 A1 | 9/2014 | Robinson et al. |
| 2014/0282923 A1 | 9/2014 | Narayan et al. |
| 2014/0299345 A1 | 10/2014 | McRoberts et al. |
| 2014/0339329 A1 | 11/2014 | Lawrence et al. |
| 2014/0351617 A1 | 11/2014 | Connell et al. |
| 2014/0360744 A1 | 12/2014 | Lawrence |
| 2015/0087288 A1 | 3/2015 | Dharawat et al. |
| 2015/0148983 A1 | 5/2015 | Fitzgibbon |
| 2015/0179011 A1 | 6/2015 | Kramer et al. |
| 2015/0193999 A1 | 7/2015 | Freese et al. |
| 2015/0205363 A1 | 7/2015 | Wu |
| 2015/0275564 A1 | 10/2015 | Rosenthal et al. |
| 2015/0281658 A1 | 10/2015 | Lee et al. |
| 2015/0308425 A1 | 10/2015 | Skotty |
| 2015/0312531 A1 | 10/2015 | Samad et al. |
| 2015/0339031 A1 | 11/2015 | Zeinstra et al. |
| 2015/0351145 A1 | 12/2015 | Burks et al. |
| 2016/0014330 A1 | 1/2016 | Deng et al. |
| 2016/0018798 A1 | 1/2016 | Jiang et al. |
| 2016/0027262 A1 | 1/2016 | Skotty et al. |
| 2016/0053699 A1 | 2/2016 | Ozkan |
| 2016/0071348 A1 | 3/2016 | Chutorash et al. |
| 2016/0093180 A1 | 3/2016 | Fitzgibbon et al. |
| 2016/0117879 A1 | 4/2016 | Chutorash et al. |
| 2016/0148494 A1 | 5/2016 | Kim |
| 2016/0189513 A1 | 6/2016 | Sloo |
| 2016/0194912 A1 | 7/2016 | Fitzgibbon et al. |
| 2016/0210844 A1 | 7/2016 | Kim |
| 2016/0281411 A1 | 9/2016 | Calagaz, Jr. et al. |
| 2016/0288647 A1 | 10/2016 | Baur |
| 2017/0169636 A1 | 6/2017 | Piche et al. |
| 2017/0198516 A1* | 7/2017 | Dey ................ E05F 15/77 |
| 2017/0294113 A1 | 10/2017 | McNabb et al. |

FOREIGN PATENT DOCUMENTS

| | | |
|---|---|---|
| CA | 2369939 | 10/2000 |
| CA | 2390885 | 1/2003 |
| DE | 3420677 | 12/1985 |
| DE | 8802513 | 4/1988 |
| DE | 4028190 | 3/1992 |
| DE | 19649054 | 5/1998 |
| EP | 0881349 | 12/1998 |
| EP | 0882866 | 12/1998 |
| EP | 0995619 | 4/2000 |
| EP | 1006310 | 6/2000 |
| EP | 1790814 | 5/2007 |
| EP | 1985787 | 10/2008 |
| EP | 2608438 | 6/2013 |
| EP | 2645638 | 10/2013 |
| EP | 2803545 | 11/2014 |
| GB | 2238578 | 6/1991 |
| KR | 20100091821 | 8/2010 |
| WO | WO01093220 | 12/2001 |
| WO | WO-2001093220 A1 | 12/2001 |
| WO | WO2005104342 | 11/2005 |
| WO | WO2007028323 | 3/2007 |
| WO | WO2007047720 | 4/2007 |
| WO | WO-2007047720 A2 | 4/2007 |
| WO | WO2012092706 | 7/2012 |
| WO | WO2012171756 | 12/2012 |
| WO | WO-2012171756 A1 | 12/2012 |
| WO | WO2014146269 | 9/2014 |
| WO | WO2014158508 | 10/2014 |

OTHER PUBLICATIONS

Ryobi, "18 Volt, 1 Hour Charger P110 Operator's Manual," downloaded from <http://manuals.ryobitools.com/documents/2101> Aug. 28, 2015 (10 pages).

Youtube, "RYOBI Garage Door Opener," <https://www.youtube.com/watch?v=RMu0Kac79oE> published Apr. 4, 2016 (1 page).

International Search Report and Written Opinion for Application No. PCT/US2017/022998 dated Jun. 9, 2017 (9 pages).

* cited by examiner

MODULAR GARAGE DOOR OPENER

CROSS-REFERENCE TO RELATED APPLICATIONS

This application claims priority to U.S. Provisional Patent Application No. 62/321,176 filed on Apr. 11, 2016, the entire content of which is incorporated herein by reference.

FIELD OF THE INVENTION

The present invention relates to garage door openers, and more particularly to garage door openers with accessories.

BACKGROUND OF THE INVENTION

Garage door openers include a drive motor coupled to a garage door to open or close the door. A garage door opener may be remotely activated by a radio-frequency remote control, by an indoor wall control, or by an outdoor keypad. Additionally, the garage door opener may include a light that is enabled upon activation of the garage door opener.

SUMMARY OF THE INVENTION

The present invention provides, in one aspect, a garage door system including a garage door opener operatively coupled to a garage door and including a housing having a plurality of ports configured to interchangeably receive a plurality of modular accessories. In some embodiments, the ability to interchange modular accessories enables customization of a garage door opener to add and remove accessories that each provide one or more additional functions to the garage door opener.

In one embodiment, a modular garage door opener system is provided. The system includes a garage door opener, an accessory port, a first accessory device, and a second accessory device. The garage door opener includes a motor that is configured to be coupled to a garage door to open and close the garage door. The accessory port is disposed on the garage door opener and includes an accessory mounting interface. The first accessory device includes a first mounting interface configured to engage the accessory mounting interface to couple the first accessory device to the accessory port. The second accessory device includes a second mounting interface configured to engage the accessory mounting interface to couple the first accessory device to the accessory port.

In some instances, the system further includes a second accessory port disposed on the garage door opener, the second accessory port including a second accessory mounting interface. The first mounting interface and the second mounting interface are further configured to engage the second accessory mounting interface.

In another embodiment, a modular garage door opener system is provided. The system includes a garage door opener, a first accessory port, a second accessory port, and an accessory device. The garage door opener includes a motor that is configured to be coupled to a garage door to open and close the garage door. The first accessory port is disposed on the garage door opener and includes a first accessory mounting interface. The second accessory port is disposed on the garage door opener and includes a second accessory mounting interface. The accessory device includes a first mounting interface that is configured to engage the first accessory mounting interface to couple the accessory device to the first accessory port, and that is configured to engage the second accessory mounting interface to couple the accessory device to the second accessory port.

In some instances, the system further includes a second accessory device including a second mounting interface configured to engage the first accessory mounting interface to couple the second accessory device to the first accessory port. The second mounting interface is further configured to engage the second accessory mounting interface to couple the second accessory device to the second accessory port.

In another embodiment, a method of operating a modular garage door system is provided. The method includes receiving, by an accessory port of a garage door opener, a first accessory device. This receiving of the first accessory device includes engaging of a first mounting interface of the first accessory device with an accessory mounting interface of the accessory port. The method further includes disengaging, by the accessory port of the garage door opener, from the first accessory device. This disengaging of the first accessory device includes decoupling of the first mounting interface of the first accessory device from the accessory mounting interface of the accessory port. The method also includes receiving, by the accessory port of the garage door opener, a second accessory device. This receiving of the second accessory device includes engaging of a second mounting interface of the second accessory device with the accessory mounting interface of the accessory port.

In some instances, the method further includes receiving, by a second accessory port of the garage door opener, the first accessory device. This receiving of the first accessory device includes engaging of the first mounting interface of the first accessory device with a second accessory mounting interface of the second accessory port.

Other features and aspects of the invention will become apparent by consideration of the following detailed description and accompanying drawings.

DETAILED DESCRIPTION

Figure 1:
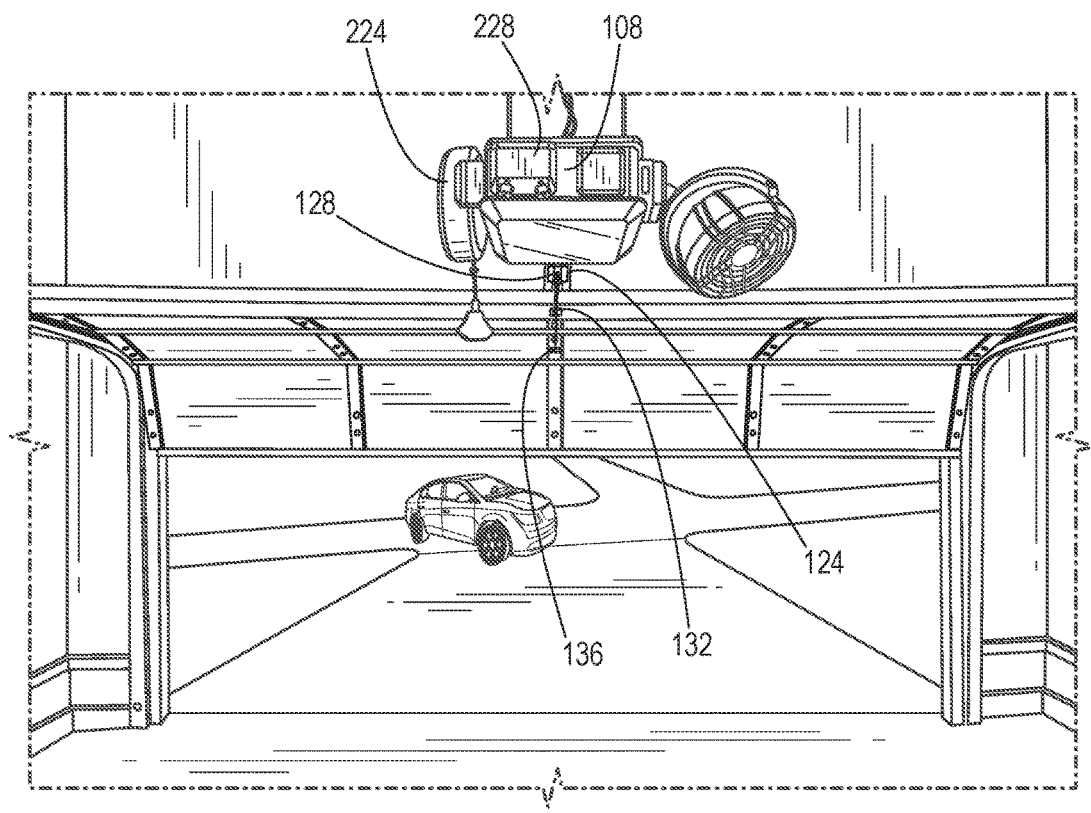
FIG. 1 is a perspective view of a garage door system.

Before any embodiments of the invention are explained in detail, it is to be understood that the invention is not limited in its application to the details of embodiment and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting.

FIGS. 1-24 illustrate a modular garage door system 50 including a garage door opener 100 operatively coupled to a garage door 104. The garage door opener 100 is configured to interchangably receive a variety of accessory devices 200 such as a battery charger 204/battery pack 208, a speaker 212, a fan 216, an extension cord reel 220, an environmental sensor 224, a park-assist laser 228, a folding light 232, a retractable area light 236, and an inflator cord reel 240, via common coupling features on both the garage door opener 100 and accessory devices 200. Accordingly, a user can attach desired accessory devices 200 to any location on the garage door opener 100, remove unwanted accessory devices 200, and organize/relocate accessory devices 200 on the garage door opener 100 as desired.

The garage door system 50 may be operated by a wall-mounted keypad 244, a passcode keypad 248, and/or a peripheral device 252 (e.g., a smartphone based application, etc.). In the illustrated embodiment, the garage door opener 100 is configured to be coupled directly to an AC power source, and optionally use the battery 208 as back-up power source when AC power is unavailable.

With reference to FIGS. 1-5, the garage door opener 100 includes a housing 108 supporting a motor 112 (e.g., a 2 HP electric motor) that is operatively coupled to a drive mechanism 116. The drive mechanism 116 includes transmission coupling the motor to a drive chain 120 having a shuttle 124 configured to be displaced along a rail assembly 128 upon actuation of the motor 112. The shuttle 124 may be selectively coupled to a trolley 132 that is slidable along the rail assembly 128 and coupled to the door 104 via an arm member.

With continued reference to FIGS. 1-5, the trolley 132 is releaseably coupled to the shuttle 124 such that the garage door system 50 is operable in a powered mode and a manual mode. In the powered mode, the trolley 132 is coupled to the shuttle 124 and the motor 112 is selectively driven in response to actuation by a user. As the motor 112 is driven, the drive chain 120 is driven by the motor 112 along the rail assembly 128 to displace the shuttle 124 (and therefore the trolley 132) thereby opening or closing the garage door 104.

In the manual mode, the trolley 132 is decoupled from the shuttle 124 such that a user may manually operate the garage door 104 to open or close without resistance from the motor 112. The trolley 132 may be decoupled, for example, when a user applies a force to a release cord 136 to disengage the trolley 132 from the shuttle 124.

In another embodiment, the drive mechanism 116 includes a transmission coupling the motor 112 to a drive belt that is operatively coupled to the garage door 104 via a rail and carriage assembly. The rail and carriage assembly includes a rail that is coupled to the main housing and a surface above the garage door opener 100 (e.g., a garage ceiling) and supports a trolley coupled to the drive belt. The trolley includes an inner trolley member and an outer trolley member. The inner trolley member is coupled to and driven by the belt, and the outer trolley member is coupled to the garage door (e.g., via a bracket).

The inner trolley member and the outer trolley member are releasably coupled to one another such that the garage door system 50 is operable in a powered mode and a manual mode. In the powered mode, the inner trolley is coupled to the outer trolley and the motor 112 is selectively driven in response to actuation by a user. As the motor 112 is driven, the belt is driven by the motor 112 along the rail to displace the trolley thereby opening or closing the garage door 104. In the manual mode, the outer trolley is decoupled from the inner trolley such that a user may manually operate the garage door 104 to open or close without resistance from the motor 112.

Figure 2:
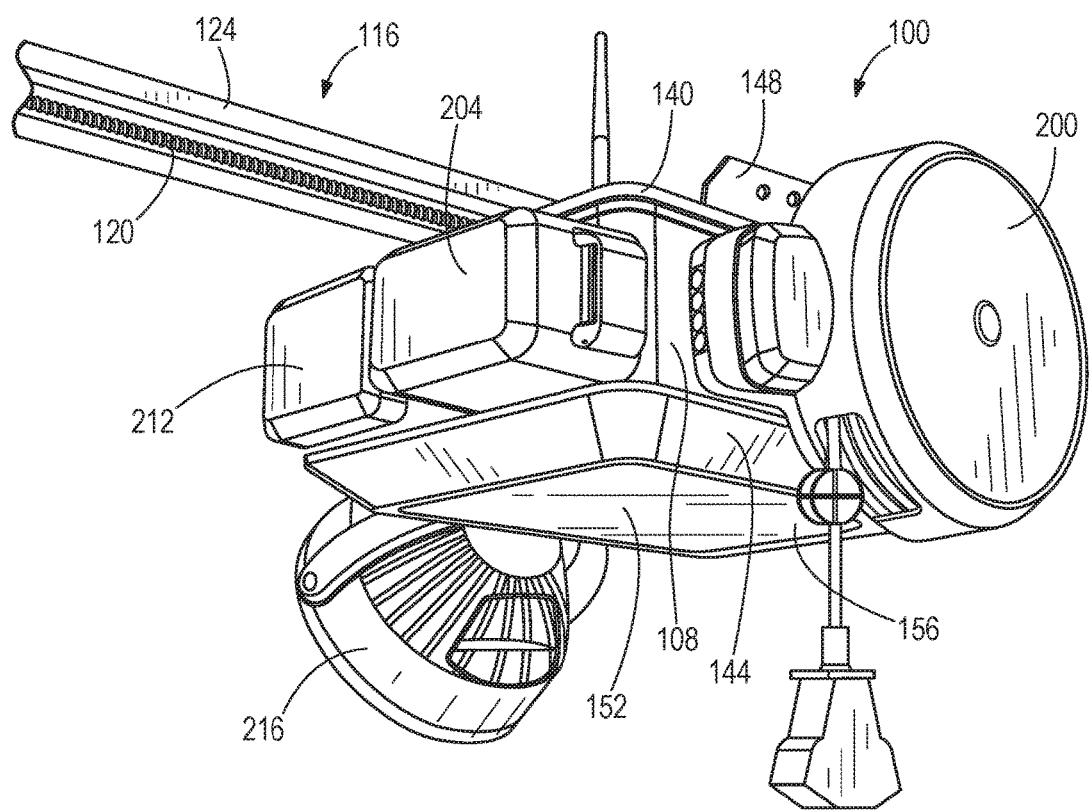
FIG. 2 is a first perspective view of a garage door opener.
Figure 3:
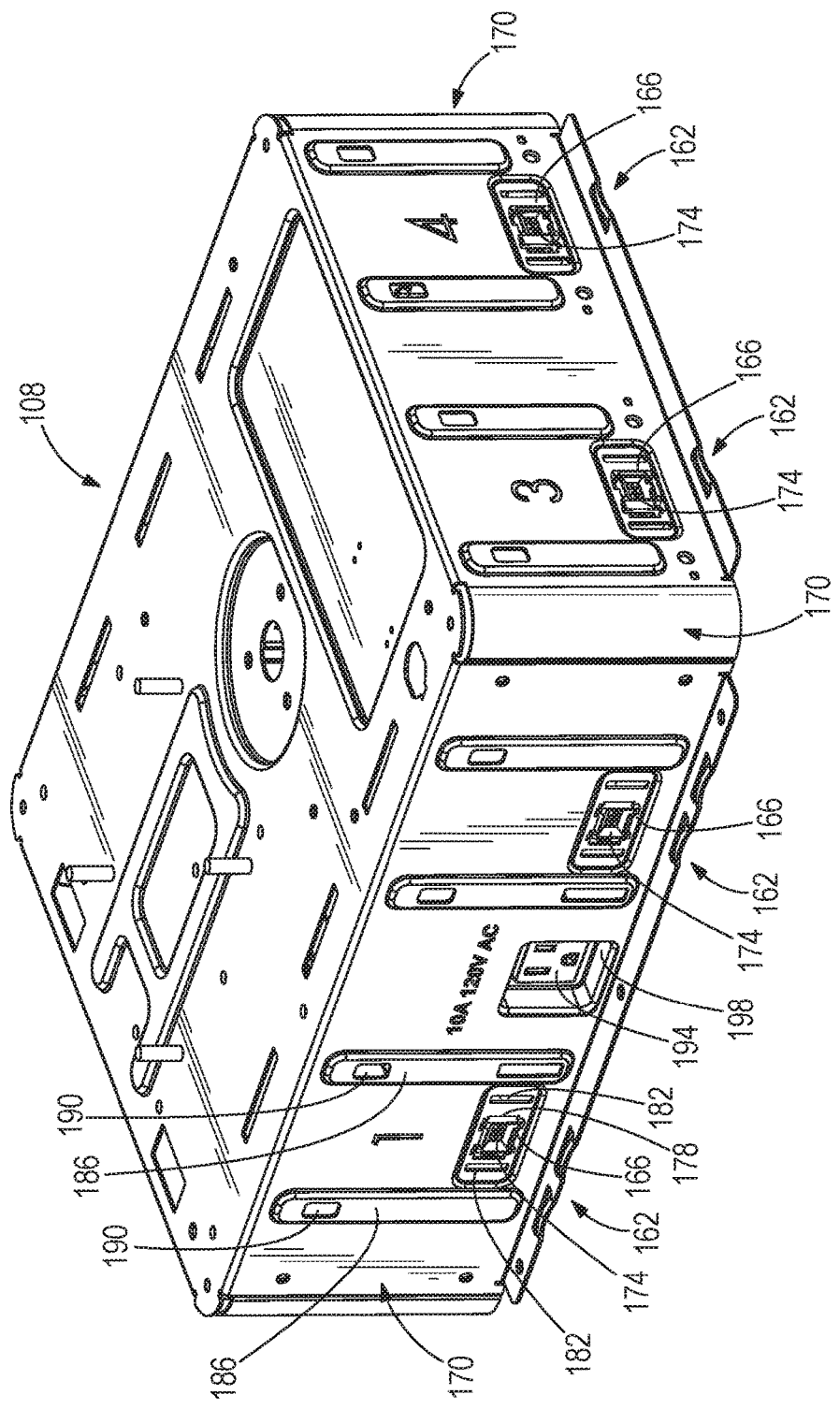
FIG. 3 is a housing of the garage door opener of FIG. 2.
Figure 4:
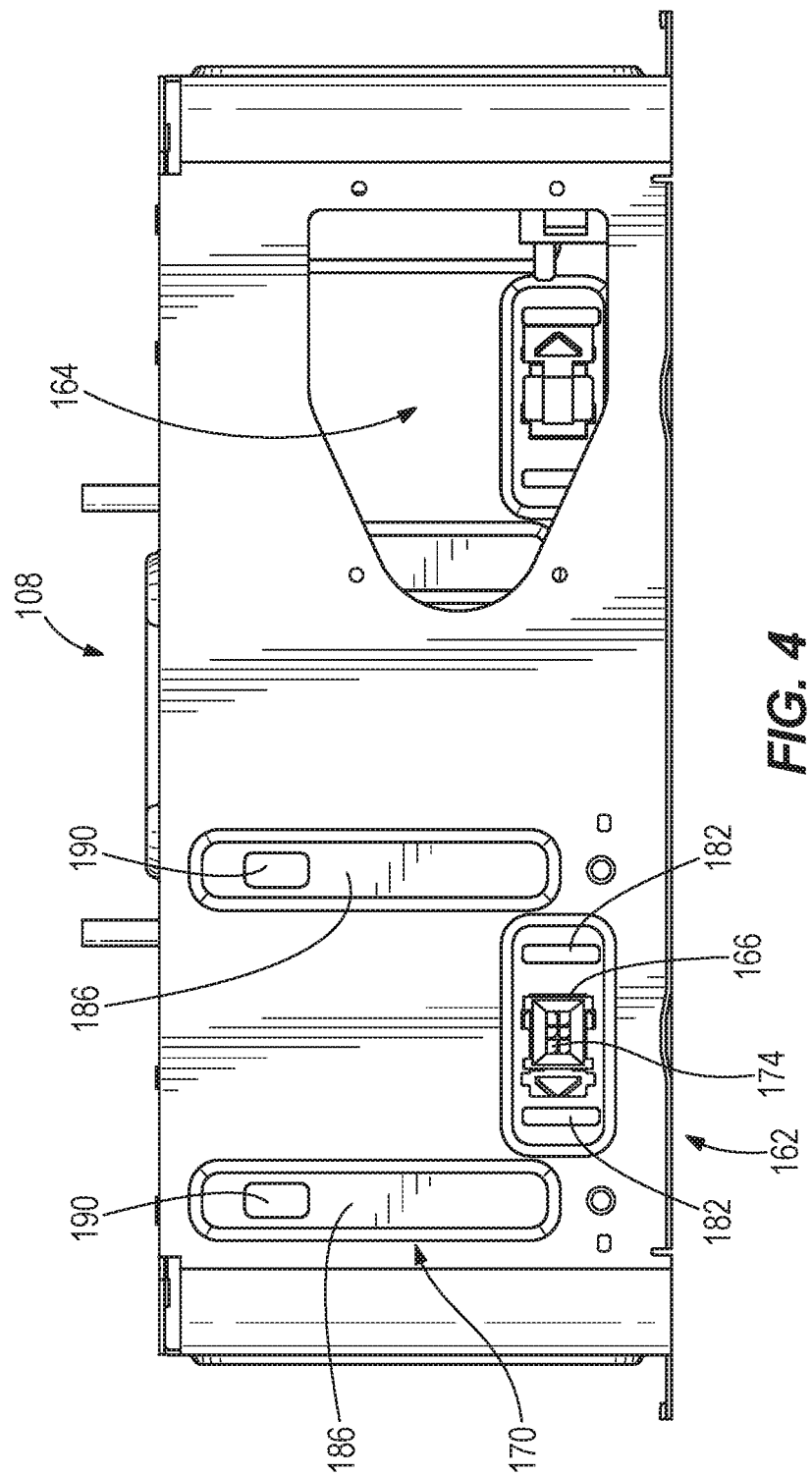
FIG. 4 is a side view of the housing of FIG. 3.

FIGS. 2-4 illustrate the garage door opener 100, which includes the housing 108 supporting the motor 112. The housing 108 is encased by an upper cover 140 and a lower cover 144, and by four sidewalls 146 extending between the upper cover 140 and the lower cover 144. The upper cover 140 is coupled to the rail assembly 128 and the surface above the garage door (e.g., the garage ceiling) by, for example, a support bracket 148. In the illustrated embodiment, the lower cover 144 supports a light 152 (e.g., one or more LED lights), enclosed by a transparent cover or lens 156, which provides light to the garage. The light 152 may either be selectively actuated by a user or automatically powered upon actuation of the garage door opener 100. In one example, the light 152 may be configured to remain powered for a predetermined amount of time after actuation of the garage door opener 100.

With reference to FIGS. 3 and 4, the housing 108 includes accessory ports 162 that receive and support modular, interchangeable accessory devices 200. In the illustrated embodiment, the housing 108 has eight accessory ports 162 with two ports 162 disposed on each side of the housing 108. However, this configuration is merely exemplary—that is, the housing 108 may include more than eight ports 162 or less than eight ports 162, and each side of the housing 108 may include more or less than two ports 162. Additionally, the housing 108 may include more or less than four sides with each having one or more ports 162, and other surfaces of the housing (e.g., the top and bottom) may include one or more ports 162.

With continued reference to FIGS. 3 and 4, each port 162 includes a communication interface 166 and a coupling interface 170. The communication interface 166 includes an electrical connector 174 disposed within a recess 178. The electrical connector 174 is configured to facilitate electrical communication and data communication between the accessory device 200 and the garage door opener 100. The electrical connector 174 may be any type of powered input/output port. Additionally, in further embodiments the electrical connector 174 may define separate power connectors and data connectors, which may similarly be any type of power connectors and data connectors.

In the illustrated embodiment, the coupling interface 170 includes two slots 182 formed on either side of the electrical connector 174, which receive a portion of an accessory device 200 to align and mechanically couple the accessory device 200 with housing 108. The coupling interface 170 further includes a pair of spaced apart, raised surfaces 186 defined on either side of the communication interface 166. Each raised surface 186 includes a chamfered edge and has an aperture 190 defined there through. However, the raised surfaces 186 may be omitted in other embodiments. The apertures 190 are configured to receive portions of the accessory devices 200 to further facilitate mechanical coupling of the accessory device 200 to the garage door opener 100.

In the illustrated embodiment, the housing 108 includes an electrical outlet 194 disposed between ports 162 on one or more sides of the housing 108 (FIG. 3). The electrical outlet 194 is a standard U.S. three-prong female AC plug 194 defined within a recess 198. However, the electrical outlet 194 may be any type of AC or DC electrical outlet. Furthermore, in the illustrated embodiment, one port 162 is omitted such that that a portion of the housing includes a customized port 164 for permanently receiving a specific accessory device 200 (e.g., a battery charging port) (FIG. 4). This type of customized port 164 may also be used in place of other ports 162 in other embodiments.

Figure 5:
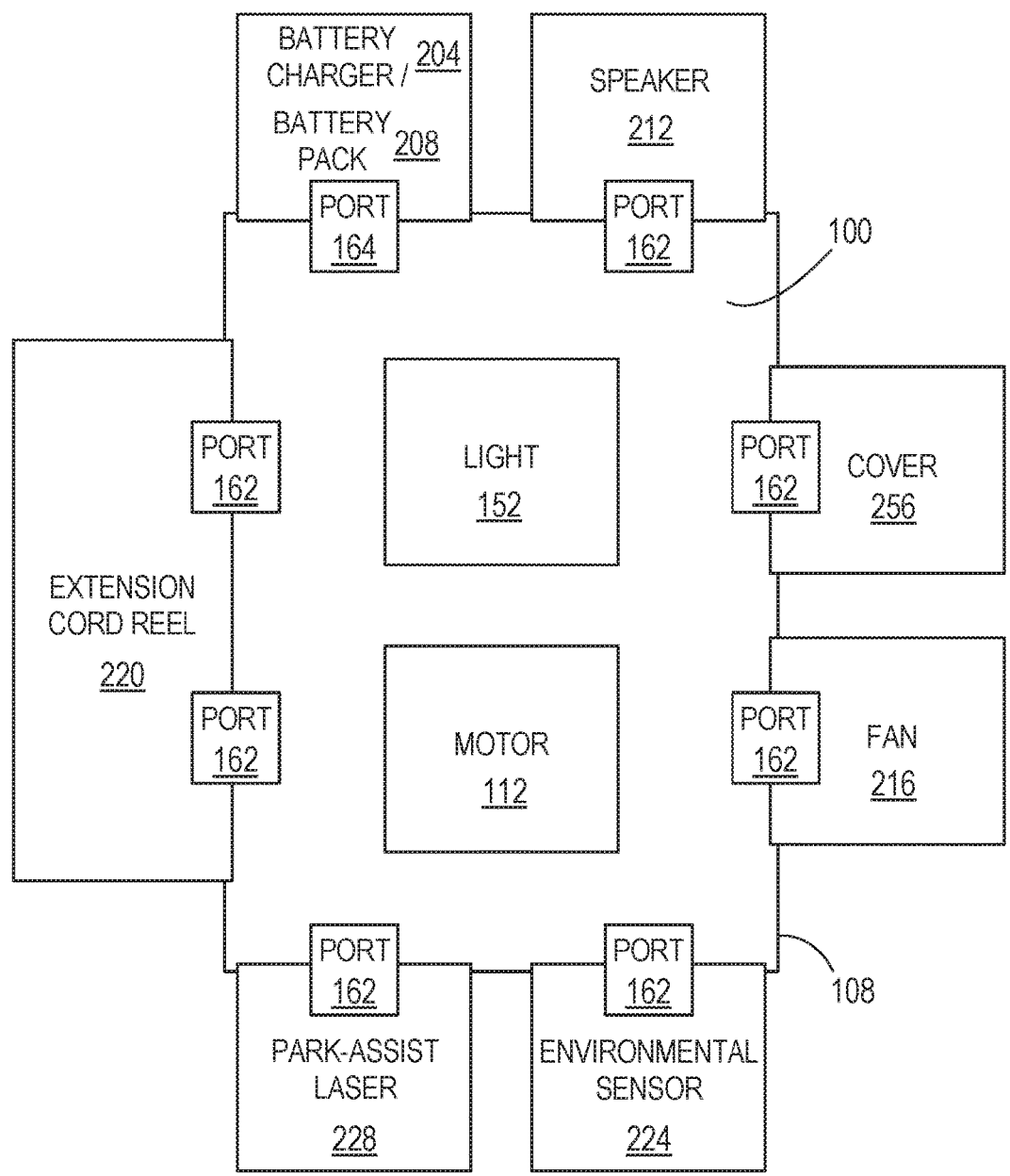
FIG. 5 is a schematic of a garage door opener according to one embodiment of the invention.

With reference to FIGS. 2 and 5, the garage door opener 100 receives a variety of different accessory devices 200 within the ports 162. In the illustrated examples, two ports 162 and the electrical outlet 194 receive the extension cord reel 220 on one side of the housing 108. On another side of the housing 108, one port 162 receives the environmental sensor 224 and the other port 162 receives the park-assist laser 228. On yet another side, one port 162 receives the fan 216 and the other port 162 is unused and blocked by a cover 256. The final side includes one of the ports 162 and the customized port 164, where the port 162 receives the speaker 212 and the customized port 164 supports the battery charger 204 for receiving a battery pack 208 (e.g., a power tool battery pack). Each accessory device 200 will be described in greater detail below with reference to FIGS. 8-19.

Additionally, the garage door opener 100 includes a controller 201 having an electronic processor and a memory. The electronic processor is configured to execute instructions stored on the memory to carry out control functions of the garage door opener 100 described herein. For example, the controller 201 is configured to one or more of control driving of the motor 112, control the enabling and disabling of the light 152, communicate with the accessory devices 200, and control the power to the accessory devices 200, as described in further detail below.

Figure 6:
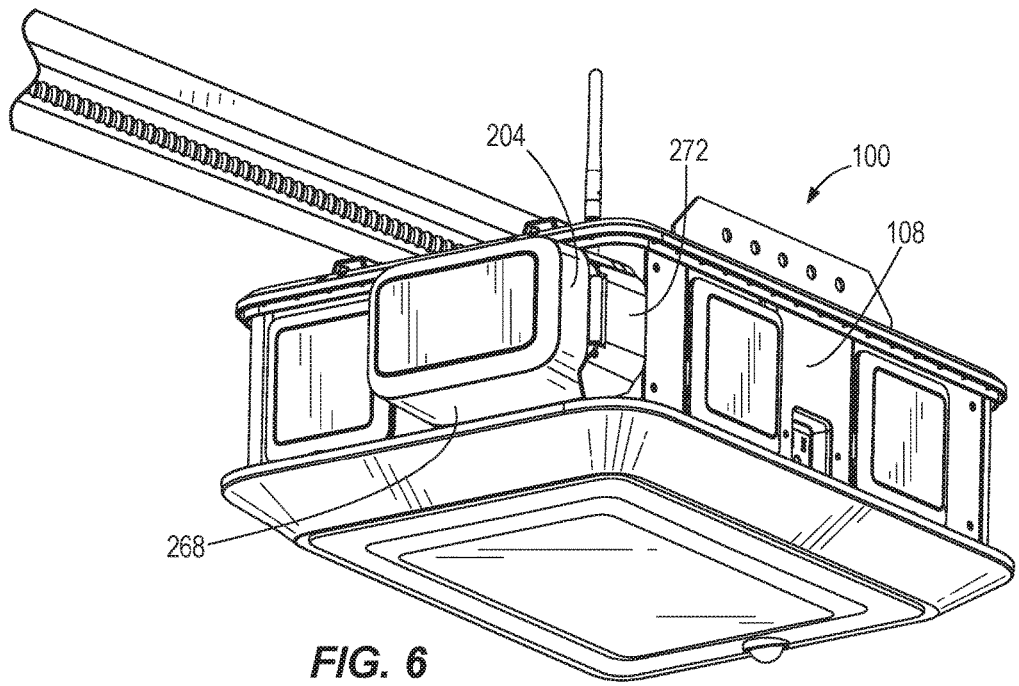
FIG. 6 is a second perspective view of the garage door opener.
Figure 7:
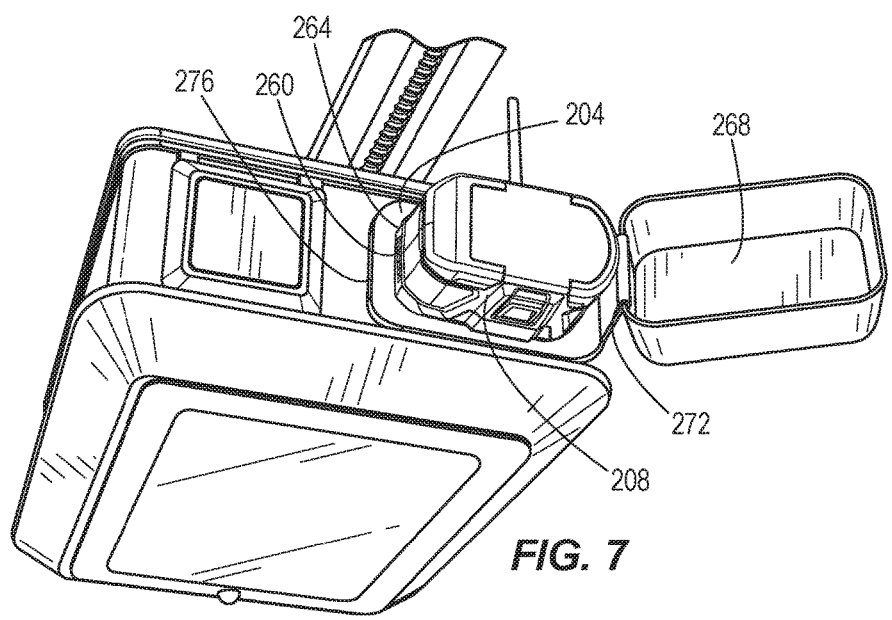
FIG. 7 is a third perspective view of the garage door opener.

FIGS. 6 and 7 illustrate the battery charger 204 disposed on the housing. In the illustrated embodiment, the battery charger 204 includes a charging port 260 including electrical contacts configured to transfer electrical charge from the garage door opener 100 to the battery pack 208. Additionally, the charging port 260 includes a mechanical coupling mechanism 264 to engage and retain the battery pack 208 within the charger. The mechanical coupling mechanism 264 may be any conventional battery pack coupling mechanism, such as those used in battery chargers and/or power tools.

The battery charger 204 further includes a door 268 pivotally coupled to a side of the battery charger 204 via a hinged connection 272 such that the door 268 is movable between a closed position (FIG. 6) and an open position (FIG. 7). The door 268 is configured to cover the battery charger 204 when a battery pack 208 is not connected. Additionally, the door 268 is sized and shaped to enclose a battery pack 208 received within the charger 204. The door 268 is retained in a closed position by a locking mechanism 276 defined by a press fit detent; however, other locking mechanisms may be used.

When a battery pack 208 is coupled to the battery charger 204, the battery pack 208 also provides power to the garage door opener 100 when the garage door opener 100 loses power—that is, the battery pack 208 serves as a 'DC battery back up.' The garage door opener 100 is configured to detect loss of power (e.g., upon a power outage at AC power source 209 (FIG. 5)) and reconfigure the battery charger 204 to receive power from the battery pack 208 when power is lost. In this way, even when the garage door system 50 loses external power, the garage door opener 100 is still able operate the garage door 104.

In one embodiment, the garage door opener 100 monitors a voltage of the battery pack 208 (e.g., at continuous intervals, continuously, etc.) when the battery pack 208 is connected to the charger 204. If the voltage is below a predetermined level, the charger is configured to charge the battery. Once the voltage of the battery reaches the predetermined level, the charger is configured to cease charging operations (e.g., via the use of a relay). In the case where AC power is lost, and the battery pack 208 is used as a battery back up to power the garage door opener 100, the battery pack 208 is operatively connected to the garage door opener 100 to power the motor 112 (e.g., via a relay activated by the loss of AC power). For example, as illustrated in FIG. 5, the garage door opener 100 may include a power supply 211 that is electrically coupled to the AC power supply 209 and to the battery pack 208 (via the port 164 and the battery charger 204). The power supply 211 may be further coupled to and provide power to the motor 112, light 152, other internal circuitry of the garage door opener 100, and the other accessory ports 162 to power any coupled accessory devices 200.

Figure 8:
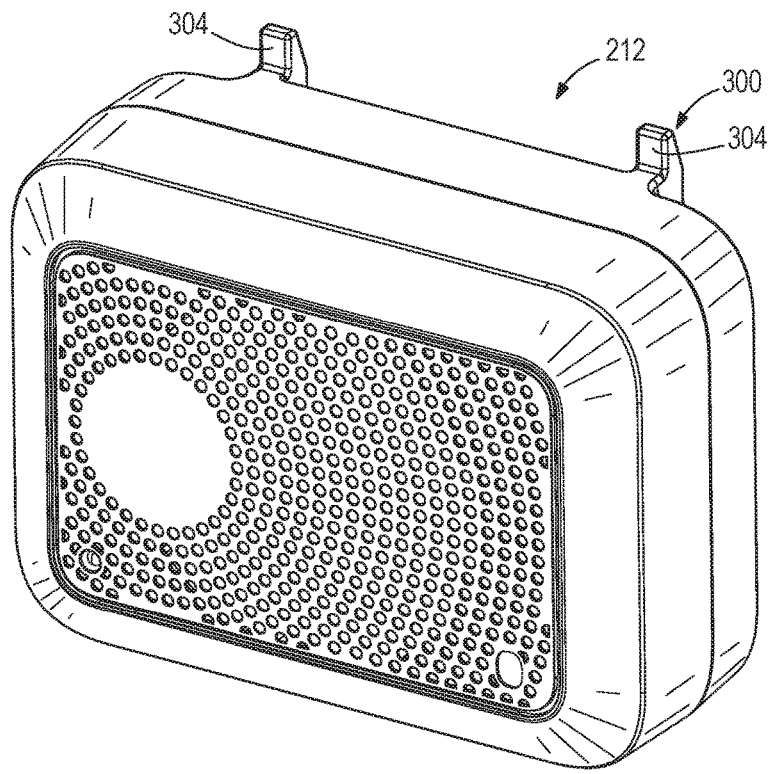
FIG. 8 is a front perspective view of an accessory speaker.
Figure 9:
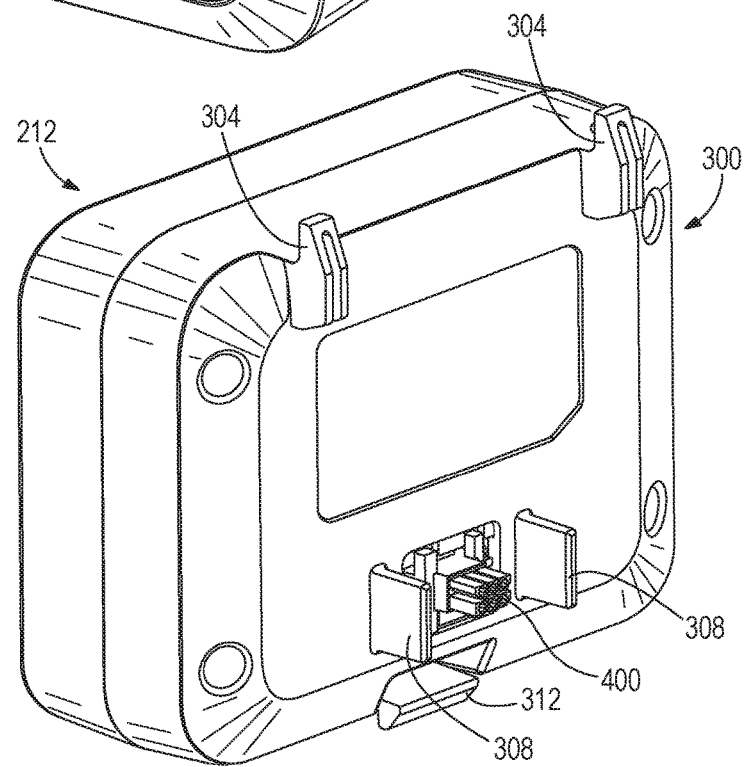
FIG. 9 is a rear perspective view of the accessory speaker.

FIGS. 8 and 9 illustrate the accessory speaker 212 configured to be detachably coupled to the garage door opener 100. In the illustrated embodiment, the speaker 212 is a wireless speaker 212 (e.g., a Bluetooth® speaker) that may be wirelessly coupled to a peripheral device 252. In one embodiment, the speaker 212 receives an audio stream from a peripheral device 252 communicating with the garage door opener 100, and subsequently drives a speaker 212 to output the audio stream using power from the garage door opener 100 via the electrical mounting interface 400. In another embodiment, the wireless speaker 212 receives an audio stream wirelessly directly from a peripheral device 252 via an integral transceiver, and drives a speaker 212 to output the audio stream using power from the garage door opener 100 via the electrical mounting interface 400.

With reference to FIG. 9, the speaker 212 includes a mechanical mounting interface 300 configured to be coupled to the coupling interface 170 of the housing 108, and an electrical mounting interface 400 configured to be coupled to the communication interface 166 of the housing 108. The mechanical mounting interface 300 includes a pair of hooks 304 that are received within the apertures 190 of the coupling interface 170, a pair of projections 308 disposed on opposing sides of the electrical mounting interface 400, and at least one protruding latch member 312 configured to engage a corresponding retention member on the housing 108. The projections 308 are configured to be received within the slots 182 to assist with alignment of the electrical mounting interface 400 and the communication interface 166. When coupled, the speaker 212 receives power from the garage door opener 100 via connection between the electrical mounting interface 400 and the communication interface 166. The speaker 212 also sends and receives data from the garage door opener 100 via connection between the electrical mounting interface 400 and the communication interface 166.

Figure 10:
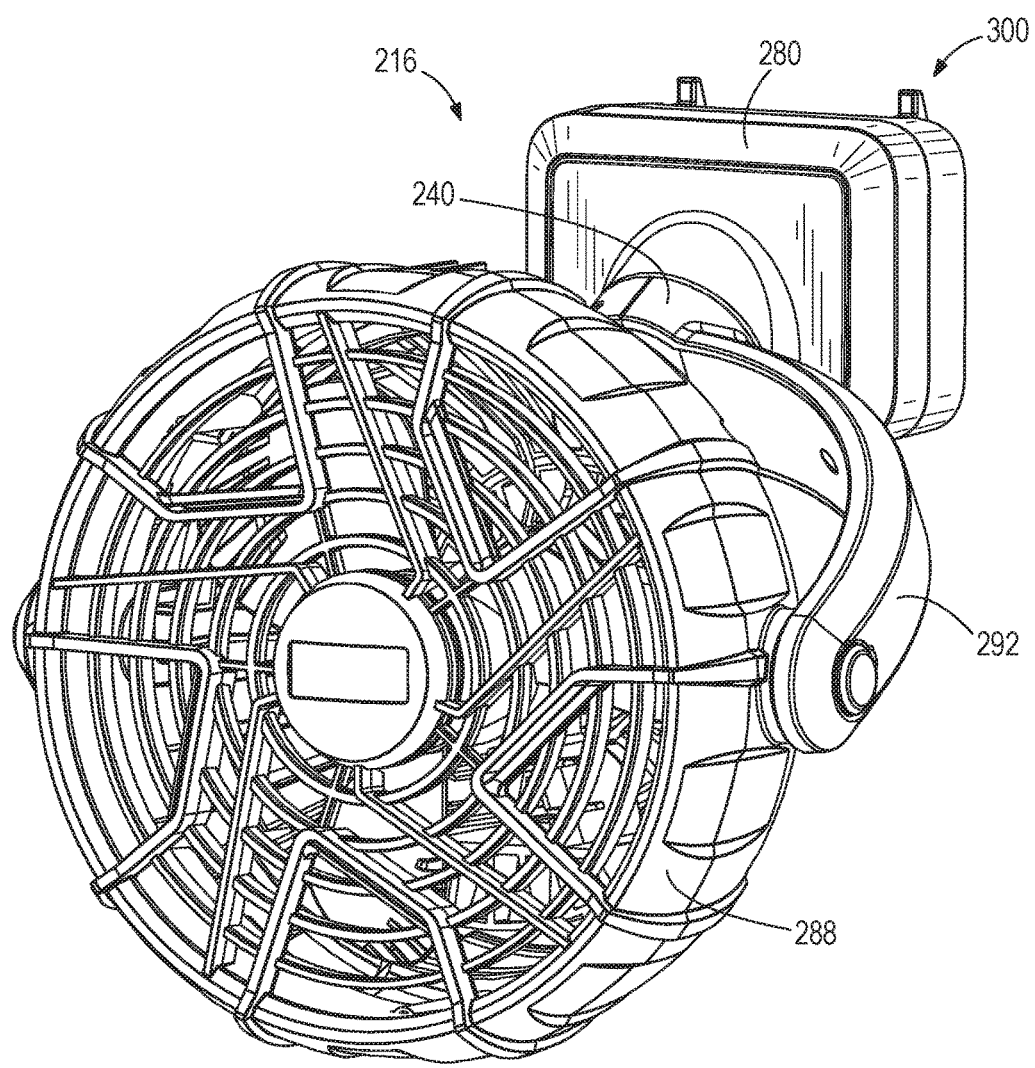
FIG. 10 is a front perspective view of an accessory fan.
Figure 11:
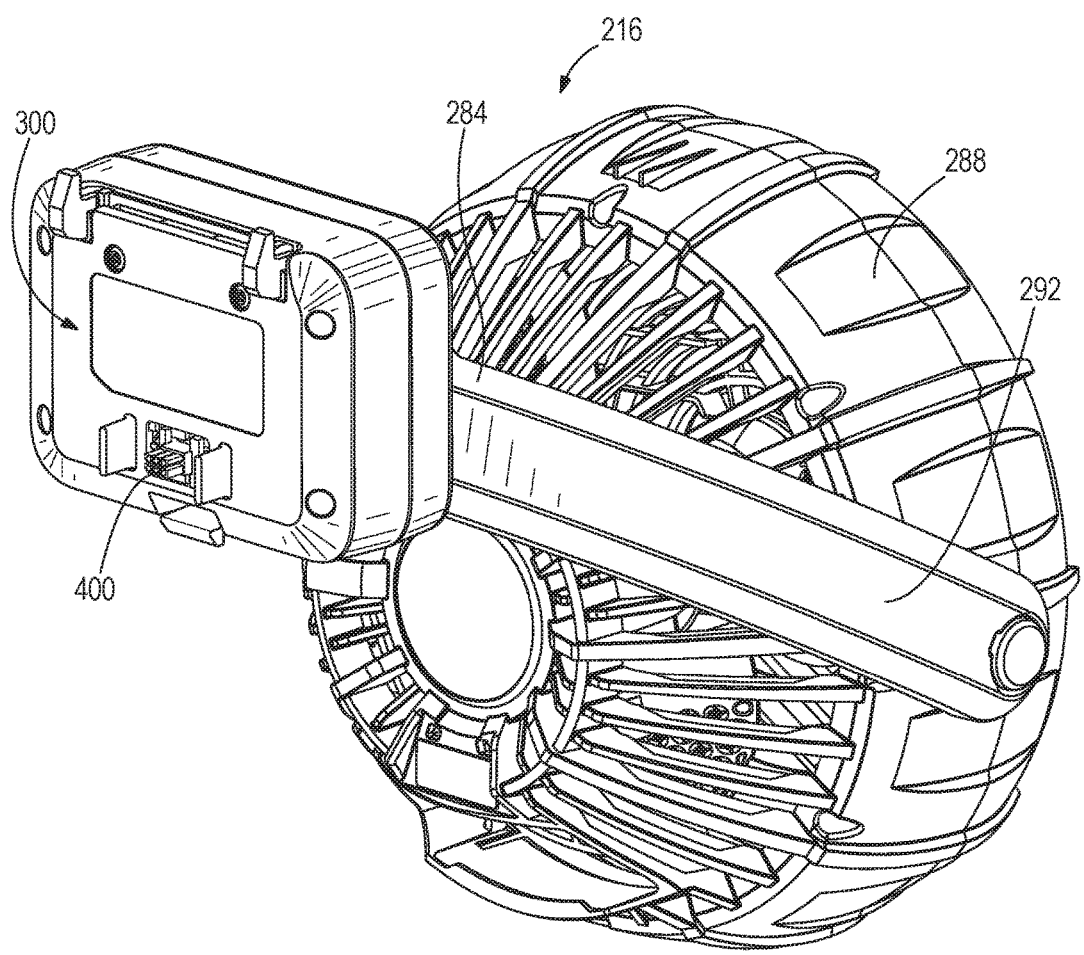
FIG. 11 is a rear perspective view of the accessory fan.

With reference to FIGS. 10 and 11, the accessory fan 216 includes a mounting member 280 supporting a rotatable and pivotal yoke 284 having a fan 288 pivotally retained between a pair opposed arms 292 (i.e., the fan is supported by a gimbal mount). As seen in FIG. 11, the mounting member 280 includes a mechanical mounting interface 300 and an electrical mounting interface 400 that are substantially similar to the interfaces described above with reference to FIGS. 8 and 9. The interfaces 300, 400 engage the housing 108 in a substantially similar matter as those described above with reference to FIGS. 8 and 9. The fan 216 includes a fan motor that drives fan blades based on power received from the garage door opener 100 via the electrical mounting interface 400.

Figure 13:
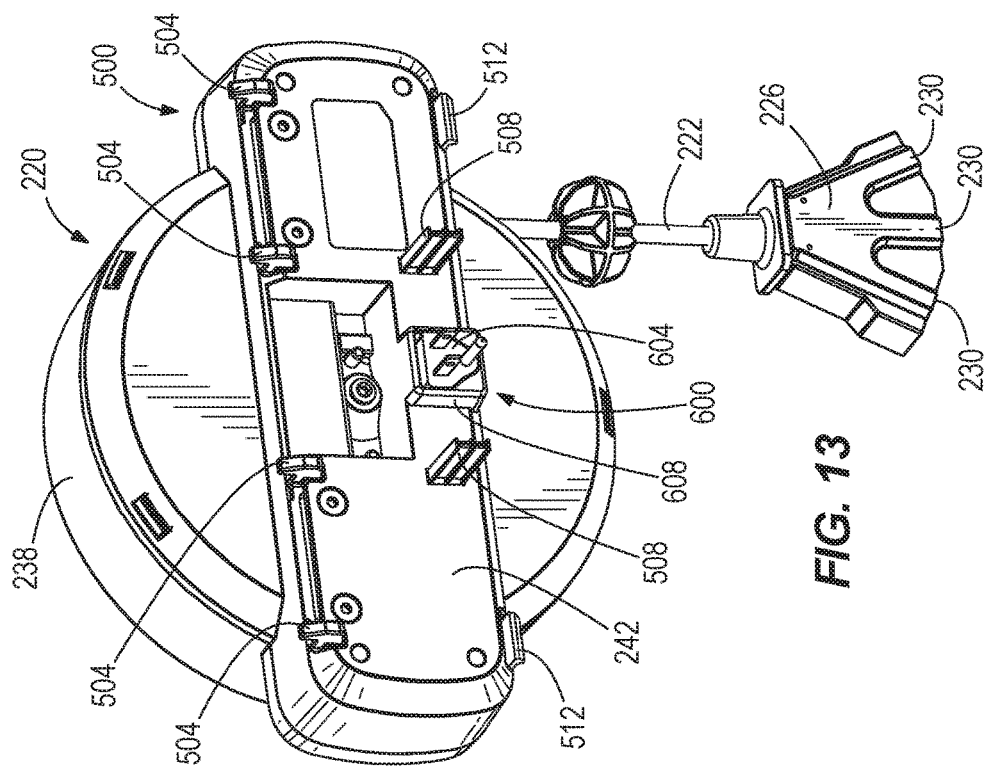
FIG. 13 is a rear perspective view of the accessory cord reel.
Figure 12:
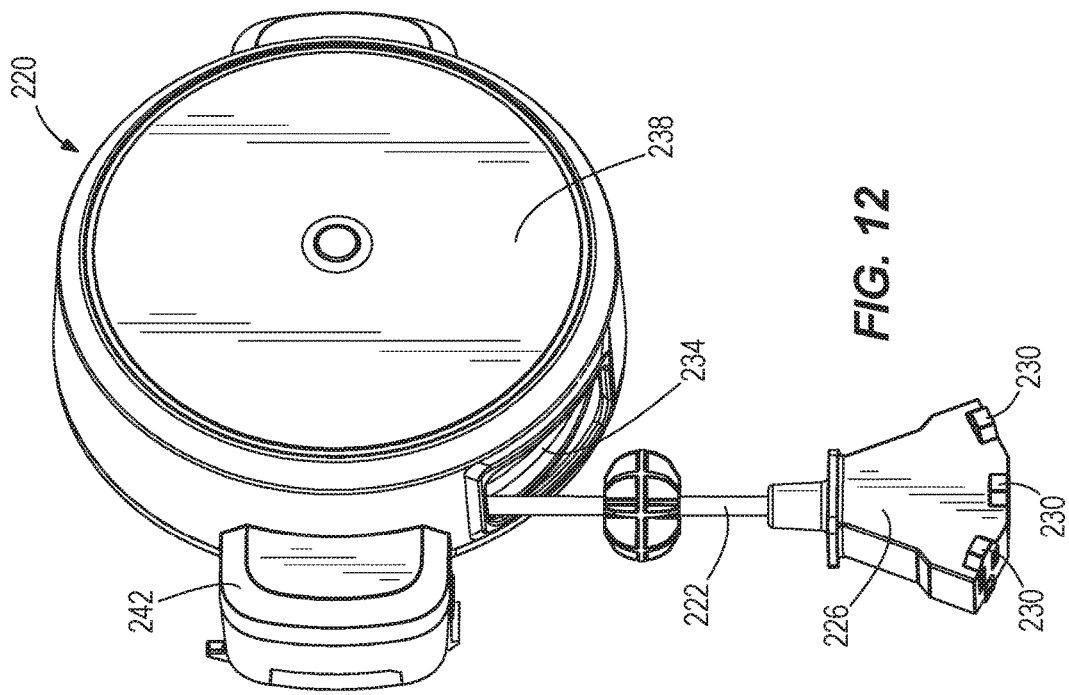
FIG. 12 is a front perspective view of an accessory cord reel.

With reference to FIGS. 12 and 13, the accessory retractable cord reel 220 includes an extension cord 222 having power outlet member 226 having power outlets 230 extending from an aperture 234 in a cylindrical main housing 238, with excess extension cord 222 being retained on a cord spooling mechanism (not shown) supported within the housing 238. In one embodiment, the cord spooling mechanism includes a rotatable plate for supporting the cord 222 that is biased by a spring (e.g., a torsion spring). The spring biases the rotatable plate to drive automatic spooling of the cord 222. The cord spooling mechanism also includes a locking member that engages the rotatable plate to fix the rotatable plate into a position allowing the cord extend from the housing at a desired length. The locking member may include a user accessible actuator (e.g., a button, a switch, etc.) or an automatic mechanism. The automatic mechanism may, for example, be engaged when the cord is extended and subsequently released via the application of a first force, and then disengaged when a second force is applied to the cord. However, other spooling mechanisms may be used as well.

With reference to FIG. 13, the main housing 238 includes a mounting plate 242 extending across a rear surface of the main housing 238. The mounting plate 242 includes a mechanical mounting interface 500 defined by four hooks 504, two projections 508, and two latch members 512. The projections 508 are disposed on opposing sides of an electrical mounting interface 600 that includes a male AC plug or plug 604 (e.g., a standard three prong US plug, other standard AC plugs, standard DC plug, etc.). The male AC plug 604 extends from an end of a projecting member 608 that is sized and shaped to be received with the recess 198 of the housing 108. In addition, the AC plug 604 is a pivotable plug to facilitate the attachment between the retractable extension cord reel 220 and the garage door opener 100.

To connect the accessory retractable extension cord reel 220 to the garage door opener 100, the accessory retractable extension cord reel 220 is angled relative to the garage door opener 100 and the hooks 504 placed in four corresponding apertures 190 of two ports 162 on one side of the garage door opener 100. The accessory retractable extension cord reel 220 is then rotated to displace the plug 604 toward the housing 108 such that projecting member 608 is received within the recess 198 and the male AC plug 604 is received by the female AC outlet 194. To account for the pivoting of the accessory retractable extension cord reel 220 relative to the garage door opener 100 during connection, the male AC plug 604 pivots so as to maintain alignment with the corresponding electrical outlet 194 on the housing 108 so the prongs of the male AC plug 604 are properly received within the female outlet 198. In operation, electricity is transferred from the garage door opener 100 to the accessory retractable extension cord reel 220 via connection between the male AC plug 604 and the female AC outlet 198.

Figure 14:
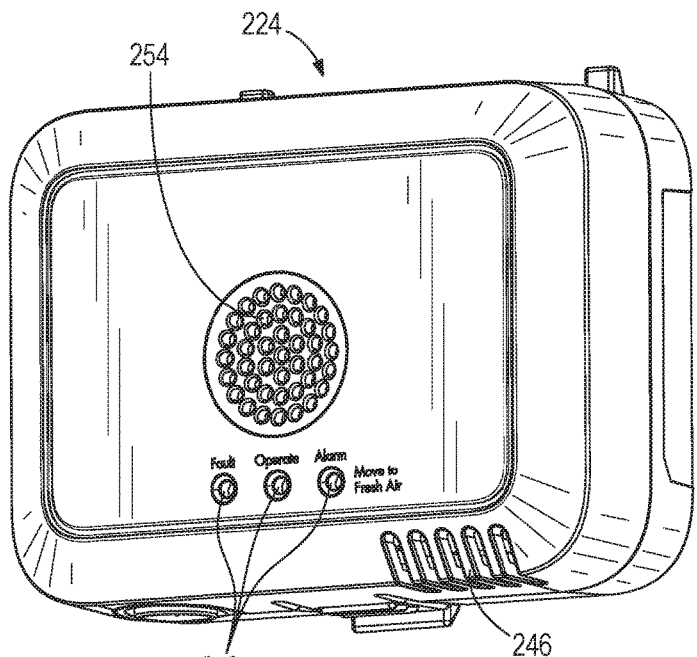
FIG. 14 is a front perspective view of an accessory environmental sensor.

FIG. 14 illustrates the environmental sensor 224. In the illustrated embodiment, the environmental sensor 224 includes an air inlet 246, indicators 250 (e.g., LEDs), and a speaker 254. The air inlet 246 allows ambient air within the garage to enter the environmental sensor 224. Inside the sensor 224, the air is analyzed to determine the presence of carbon monoxide. The environmental sensor 224 provides an alert to a user within the garage. For example, one of the indicators 250 may be activated to indicate the presence of carbon monoxide within the garage and/or the speaker 254 is activated to sound an alarm. Furthermore, in some embodiments, the environmental sensor 224 communicates the presence of carbon monoxide to a peripheral device 252 (e.g., a cell phone, a computing device, one of the keypads, etc.) either directly or via the garage door opener 100.

Although the illustrated environmental sensor 224 is a carbon monoxide detector, other air characteristics may be analyzed in addition to or in place of carbon monoxide. For example, other air characteristics may include humidity, temperature, and the presence of other gases (e.g., smoke, etc.). In other embodiments, the environmental sensor 224 may include a display (e.g., LCD, etc.) for displaying air characteristics to the user.

The environmental sensor 224 includes a mechanical mounting interface 300 and an electrical mounting interface 400 on a rear surface (not shown) that are substantially similar to the interfaces described above with reference to FIGS. 8 and 9. The interfaces 300, 400 engage the housing in a substantially similar manner as those described above with reference to FIGS. 8 and 9. The environmental sensor 224 is powered via power received from the garage door opener 100 over the electrical mounting interface 400.

Figure 15:
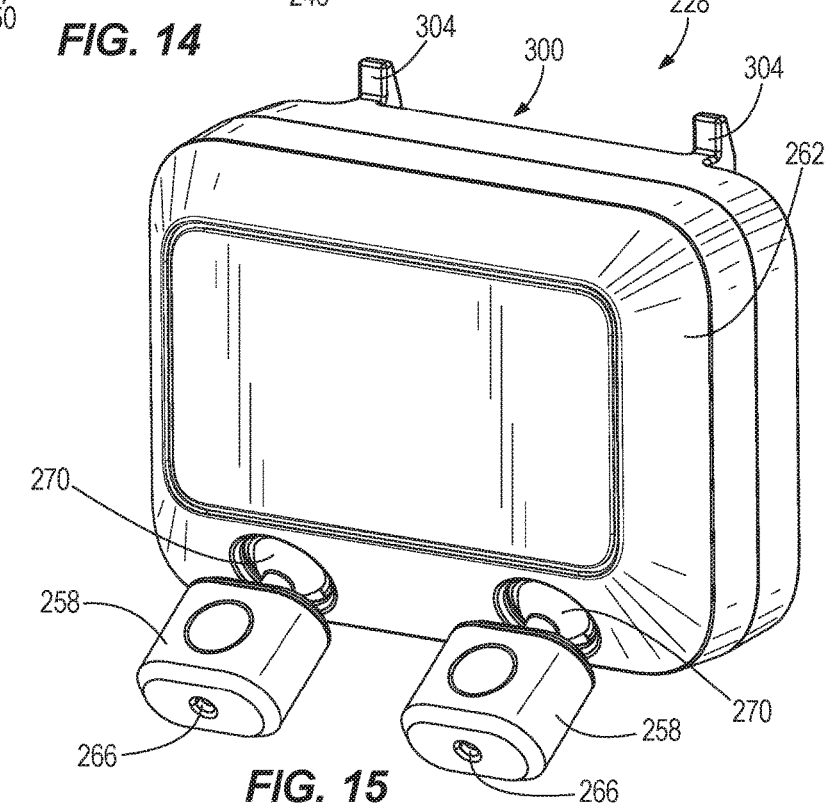
FIG. 15 is a front perspective view of an accessory park-assist laser.
Figure 16:
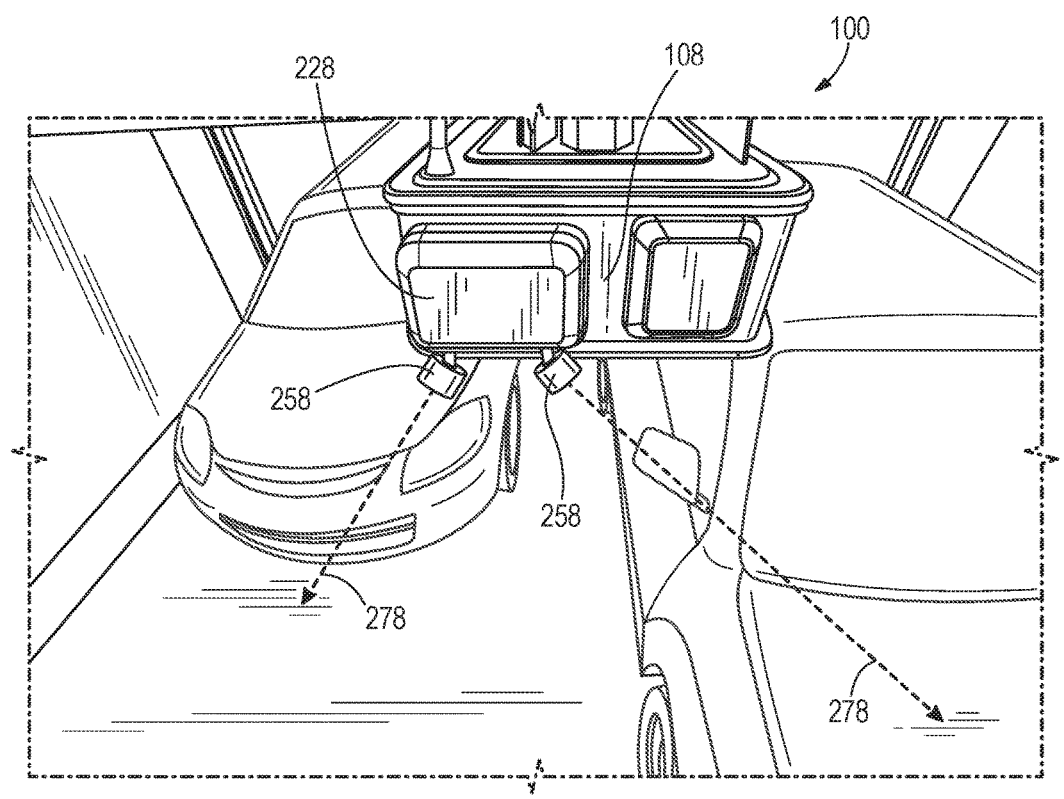
FIG. 16 is a perspective view of the garage door opener system including the accessory park-assist laser of FIG. 15.

FIGS. 15 and 16 illustrate the park-assist laser 228, which includes one or more adjustable laser units 258 coupled to a main housing 262. In the illustrated embodiment, each laser unit 258 includes a laser 266 and a spherical coupling end 270 that is movably received within a recess 274 on the housing 262. The park-assist laser 228 further includes a mechanical mounting interface 300 and an electrical mounting interface 400 on a rear surface (not shown) that are substantially similar to the interfaces described above with reference to FIGS. 8 and 9. The interfaces 300, 400 engage the housing in a substantially similar manner as those described above with reference to FIGS. 8 and 9. The park-assist laser 228 is powered via power received from the garage door opener 100 over the electrical mounting interface 400.

With reference to FIG. 16, the laser units 258 are adjustable by a user such that the lasers 266 are oriented to direct visible laser light 278 toward a floor of the garage. The laser light 278 provides a user with a visible reference point to assist the user with parking a vehicle. The lasers 266 may be manually powered by a user when desired for use (e.g., via a peripheral device). In addition, the lasers 266 may be automatically powered when the garage door opener 100 is actuated. In one specific example, the lasers 266 may be actuated for a predetermined period of time after the garage door opener 100 has been actuated.

Figure 17:
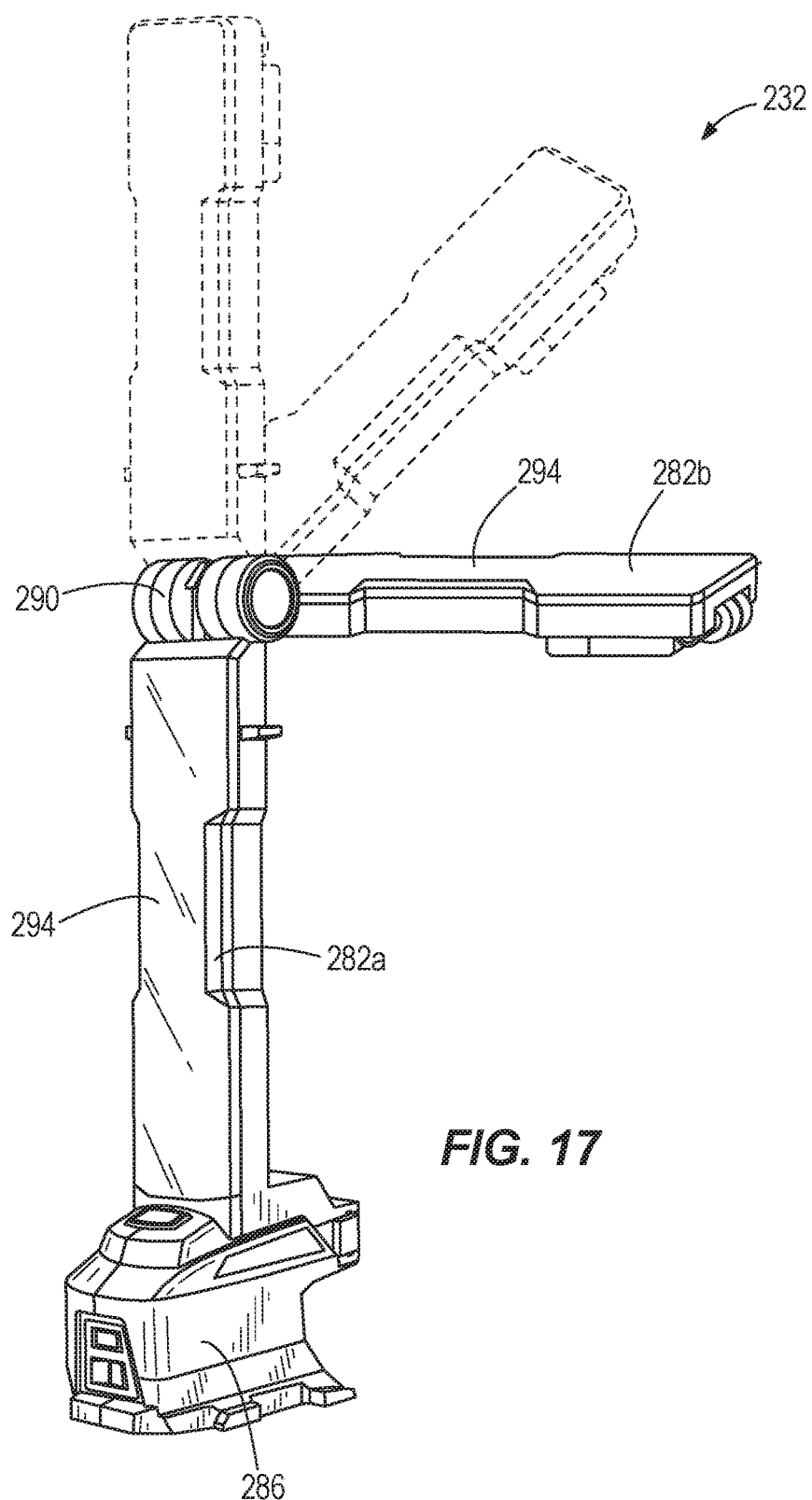
FIG. 17 is a perspective view of an accessory folding light.

With reference to FIG. 17, the folding light 232 includes a pair of lighting sections 282 extending away from a base portion 286. The lighting sections 282 include one or more pivoting connections 290. In the illustrated embodiment, a first lighting section 282a is pivotally coupled to the base portion 286, and the first lighting section 282a is also pivotally coupled a second lighting portion 282b. Furthermore, each pivoting connection 290 permits movement in more than one plane. Each lighting section support one or more lights 294 (e.g., LED lights or strips) encased by a lens. The lighting sections 282 are selectively actuated independently of one another.

The folding light 232 further includes a mechanical mounting interface 300 and an electrical mounting interface 400 on the base portion 286 that are substantially similar to the interfaces described above with reference to FIGS. 8 and 9. The interfaces 300, 400 engage the housing in a substantially similar manner as those described above with reference to FIGS. 8 and 9. The folding light 232 is powered via power received from the garage door opener 100 over the electrical mounting interface 400.

Figure 18:
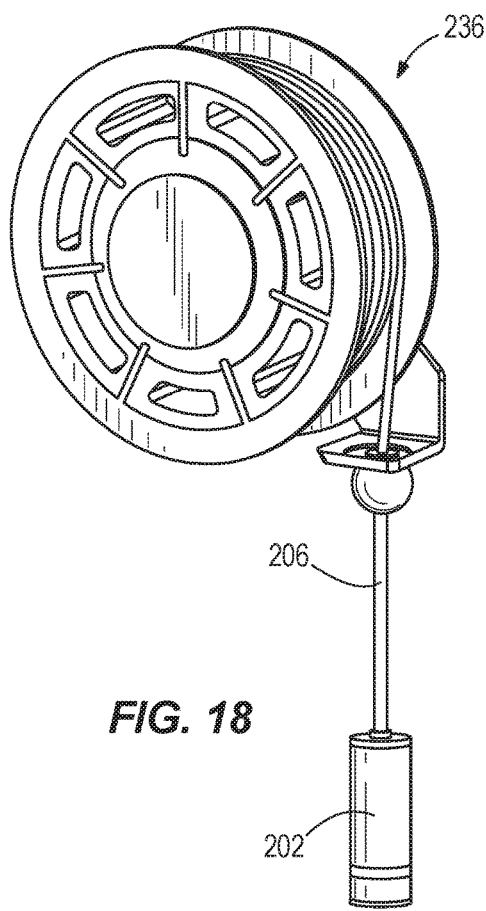
FIG. 18 is a perspective view of an accessory area light.

With reference to FIG. 18, the retractable area light 236 includes an area light 202 disposed on one end of a retractable cord 206. The retractable cord 206 is wrapped around a cord spooling mechanism. The cord spooling mechanism is substantially similar to the cord spooling mechanism described above with reference to FIGS. 12 and 13.

With continued reference to FIG. 18, the retractable area light further 236 includes a mechanical mounting interface 300 and an electrical mounting 400 interface on a rear surface that are substantially similar to the interfaces described above with reference to FIGS. 8 and 9. The interfaces 300, 400 engage the housing in a substantially similar manner as those described above with reference to FIGS. 8 and 9. Alternatively, the retractable area light 236 may include a mounting plate that is substantially similar to the mounting plate 242 described above with reference to FIGS. 12 and 13. The retractable area light 236 is powered via power received from the garage door opener 100 over the electrical mounting interface 400.

Figure 19:
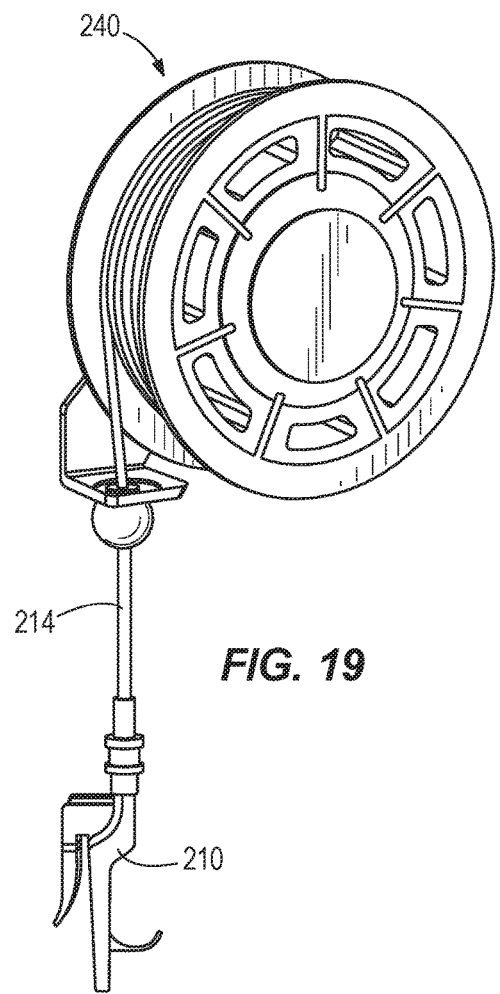
FIG. 19 is a perspective view of an accessory inflator.

With reference to FIG. 19, the accessory inflator cord reel 240 includes an inflator or air delivery nozzle 210 disposed on one end of a retractable cord 214. The retractable cord 214 is wrapped around a cord spooling mechanism. The cord spooling mechanism is substantially similar to the cord spooling mechanism described above with reference to FIGS. 12 and 13.

With continued reference to FIG. 19, the inflator reel 240 further includes a mechanical mounting interface 300 and an electrical mounting interface 400 on a rear surface that are substantially similar to the interfaces described above with reference to FIGS. 8 and 9. The interfaces 300, 400 engage the housing in a substantially similar manner as those described above with reference to FIGS. 8 and 9.

The inflator reel 240 is configured to be operatively coupled to a compressor (not shown) in order to provide compressed air to peripheral objects (e.g., a car tire, etc.). The compressor may be directly coupled to/supported on the garage door opener 100. Alternatively, the compressor may be placed remotely from the garage door opener 100 but configured to be fluidly coupled to the inflator reel 240 (e.g., via tubes extending from the compressor to the inflator reel 240).

The modular garage door system 50 provides a garage door opener 100 that can receive a variety of accessory devices 200 in any combination for use with the garage door opener 100. The identical ports 162 located about the housing 108 allow accessory devices 200 to be located in multiple locations on the garage door opener 100 because each of the accessory devices 200 described in FIGS. 6-11 and 14-19 includes similar mechanical mounting interfaces 300 and electrical mounting interfaces 400 to engage each identical port 162. Accordingly, the accessory devices 200 can be removed, relocated, and replaced on the ports 162 of the garage door opener 100 as desired. Further, a user can determine which accessory devices 200 are best suited for their needs and personalize the system 50 by coupling preferred accessory devices 200 to the garage door opener 100 as needed. The system 50 allows many accessories commonly used within a garage to be attached and powered by a single power source via the garage door opener 100.

Figure 20:
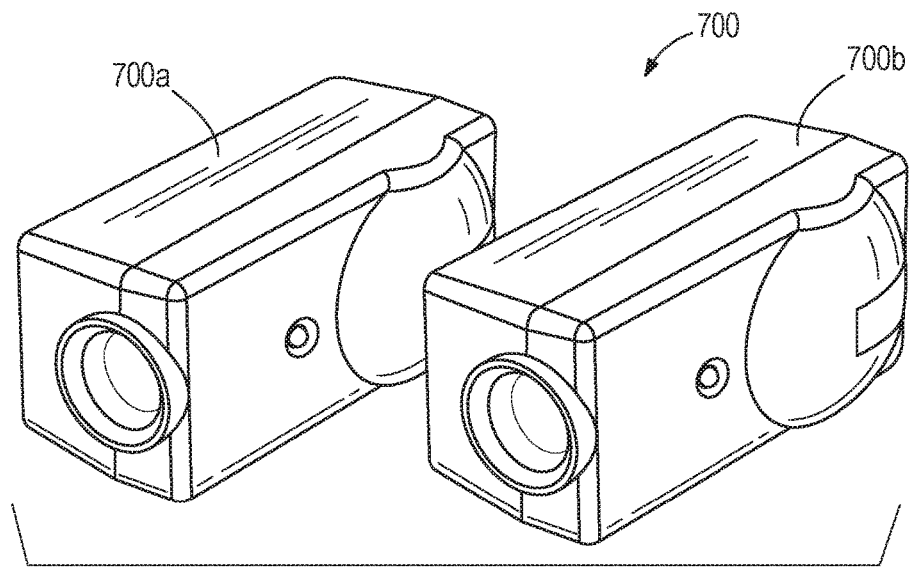
FIG. 20 is a perspective view of a pair of obstruction sensors.
Figure 21:
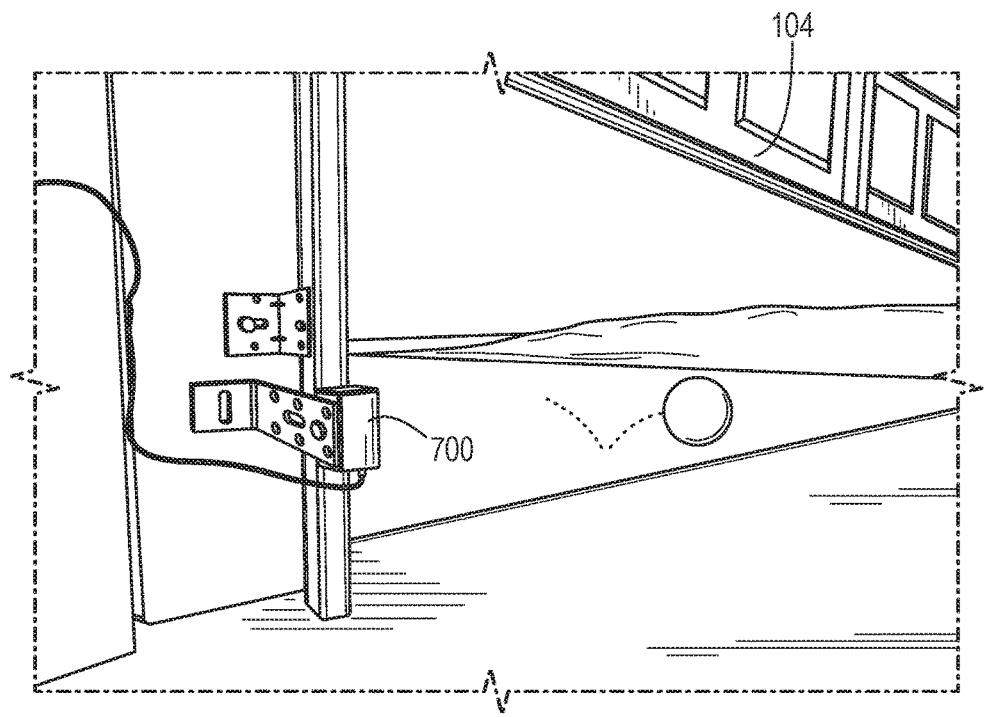
FIG. 21 is a perspective view of the obstruction sensors of FIG. 20 being used in the garage door opener system.

FIGS. 20 and 21 illustrate a pair of obstacle detection sensors 700a, 700b. As seen in FIG. 21, the obstacle detection sensors 700a, 700b are mounted on opposing sides of the garage door 104 in facing relation to one another. The obstacle detection sensors 700a, 700b include a transmitter (e.g., sensor 700a) and a receiver (e.g., sensor 700b), where the transmitter directs a beam of light (e.g., infrared light) toward the receiver. If the beam is interrupted (i.e., an object passes through the beam) during operation of the garage door 104, the obstacle sensor sends a signal to the garage door opener 100 to pause and/or reverse operation. The obstacle sensors 700a, 700b may communicate with the garage door opener 100 via a wired or wireless connection.

Figure 22:
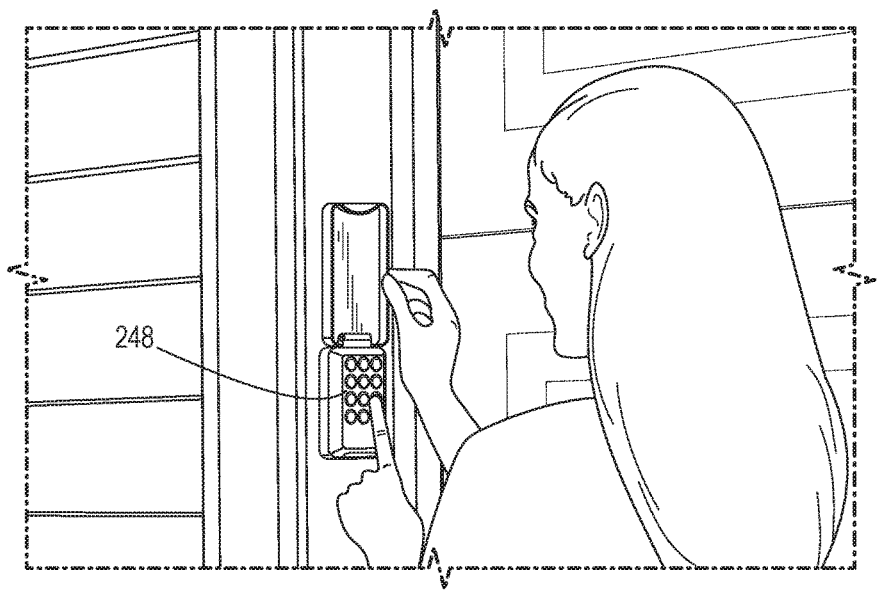
FIG. 22 is a photograph of a passcode keypad for use with the garage door opener system of FIG. 1.
Figure 23:
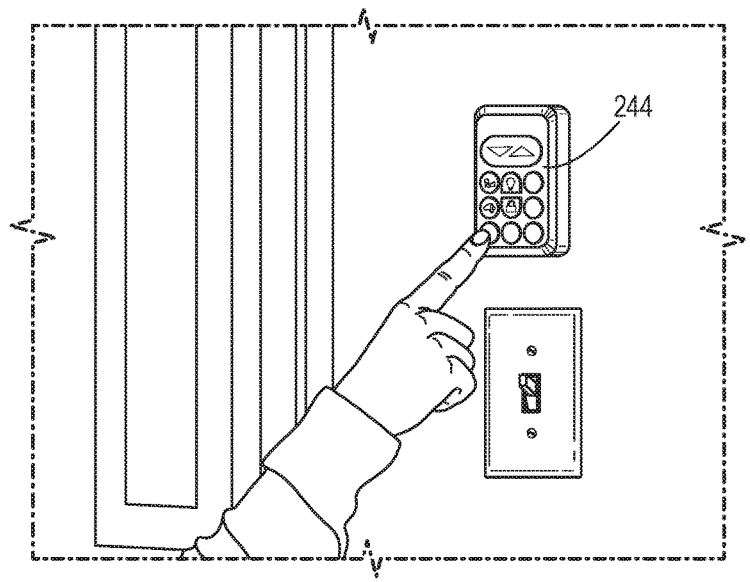
FIG. 23 is a photograph of a wall-mounted keypad for use with the garage door opener system of FIG. 1.

FIGS. 22 and 23 illustrate exemplary control devices for the garage door system 50. FIG. 22 illustrates a passcode keypad 248 including buttons. The passcode keypad 248 requires a user to press a specific sequence of buttons in order to actuate the garage door opener 100 to open or close the garage door 104. The passcode keypad 248 may be placed on a surface that is outside of the garage, and operatively communicates with the garage door opener 100 via a wired or wireless connection (e.g., via radio frequency communication).

FIG. 23 illustrates a wall-mounted keypad 244 having buttons and a display. The buttons operate the door to open or close, as well as operate specific features of the garage door opener 100 (e.g., the light) or accessory devices 200. The display shows the status of the garage door as well as the status of accessory devices 200 coupled to the garage door opener 100. As seen in FIG. 23, the wall-mounted keypad 244 may be mounted to a wall within the garage, and operatively communicates with the garage door opener 100 via a wired or wireless connection (e.g., via radio frequency communication).

Figure 24:
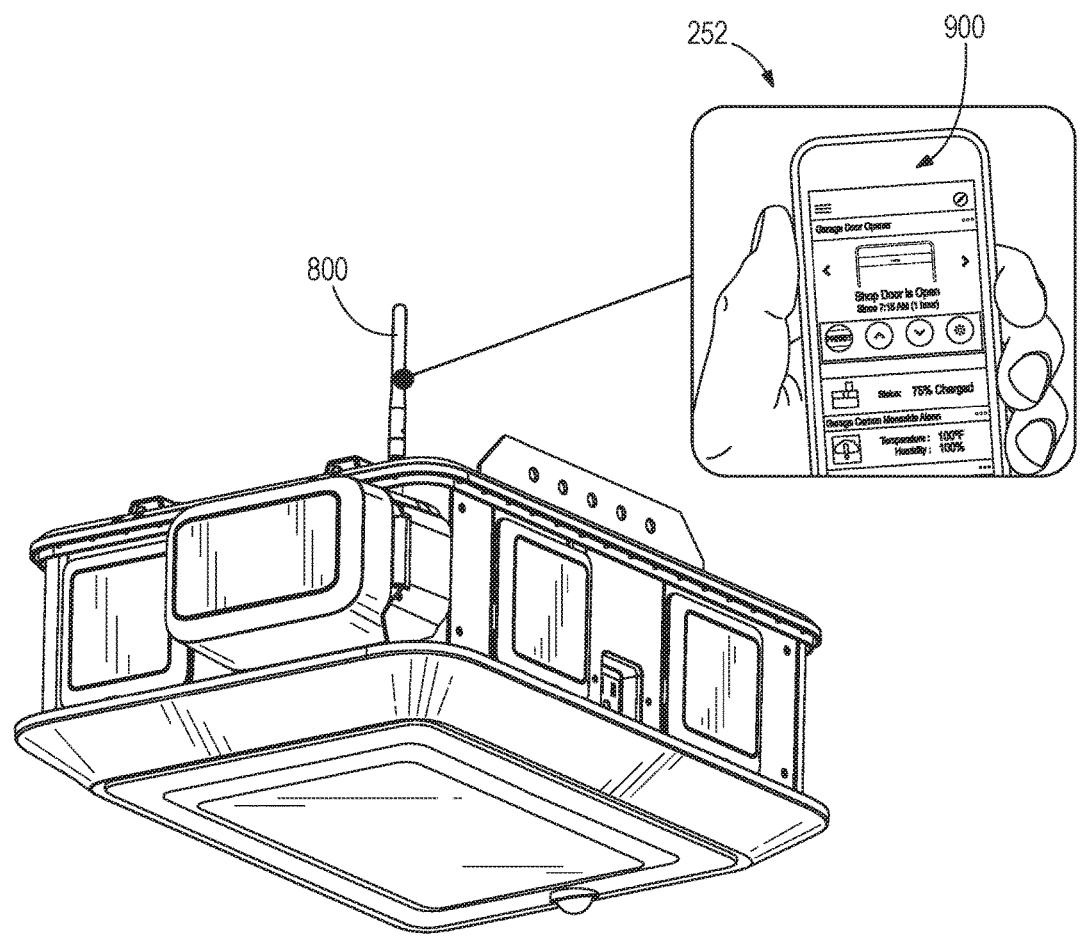
FIG. 24 is a perspective view of the garage door opener including a transceiver in communication with a peripheral device.
Figure 25:
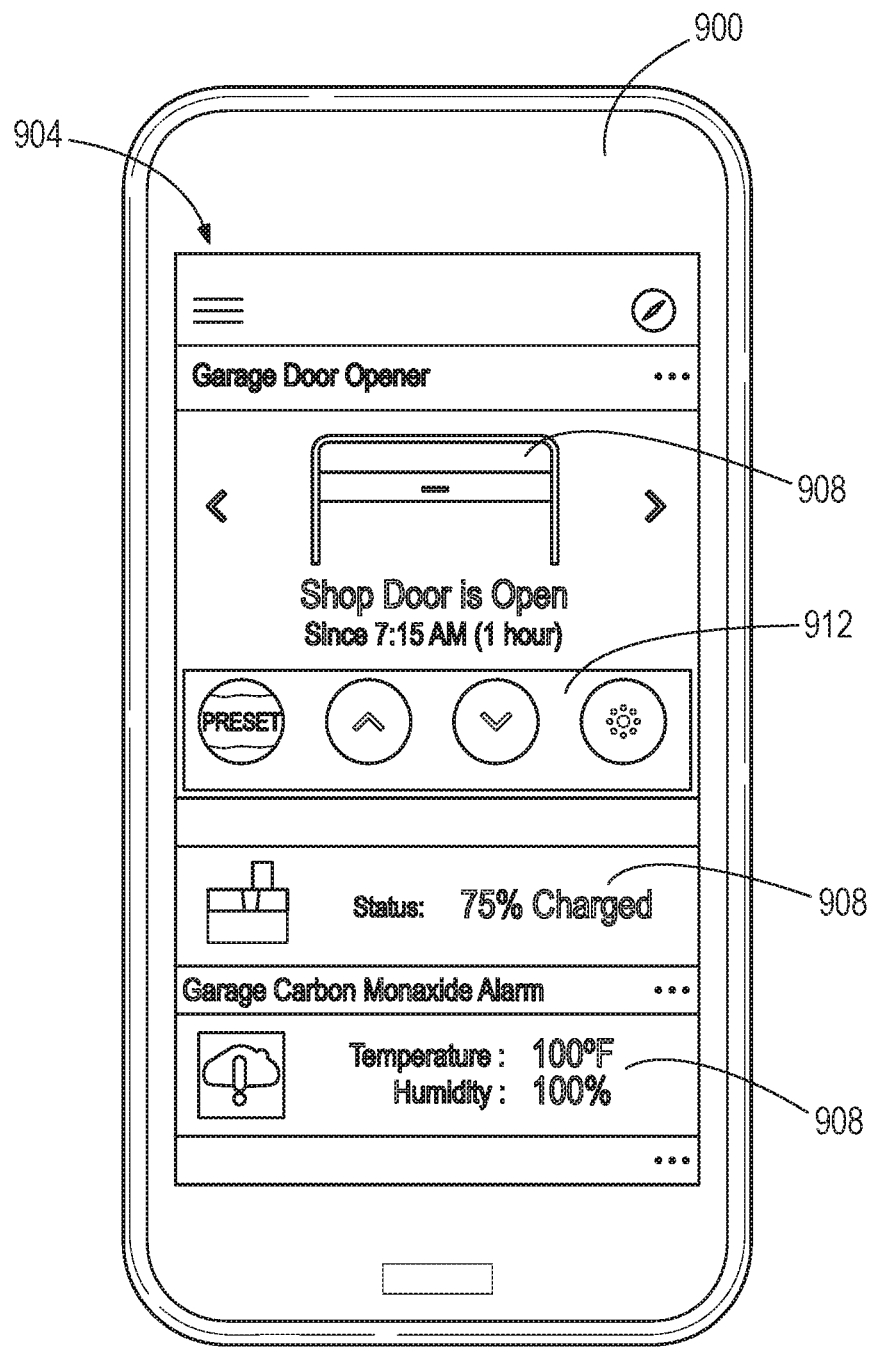
FIG. 25 is a perspective view of a peripheral device application for use with the garage door opener system of FIG. 1.

With reference to FIGS. 24 and 25, the garage door opener 100 includes a one or more transceivers 800 for communicating with peripheral devices 252. In one embodiment, the garage door opener 100 includes a first radio frequency transceiver 800a in communication with the passcode keypad 248, the wall-mounted keypad 248, and one or more remotes (e.g., portable car remote controllers) and a second transceiver 800b in communication with a network and/or one or more peripheral devices 252 (e.g., a smartphone or other computing device). The second transceiver 800b communicates with the network and/or peripheral devices 252 via radio frequency communication, Wi-Fi communication, Bluetooth communication, or any other acceptable communication protocols. In another embodiment, the garage door opener 100 includes a single transceiver communicating with each of the peripheral devices 252.

Each of the first and second transceivers 800*a*, 800*b* is further in communication with a controller 804 disposed within the garage door opener 100. The transceivers 800*a*, 800*b* receive data and commands from their respective peripheral devices 252 and direct them to the controller 804, which further directs the data to appropriate components (e.g., the motor, light, etc.) or accessory devices 200 of the garage door opener 100. In addition, the controller 804 receives data and commands from the components and the accessory devices 200 coupled to the garage door opener 100, and subsequently directs the data and commands to the appropriate transceiver 800*a*, 800*b* in order to communicate the data and commands to the appropriate peripheral device 252.

In one example, one peripheral device is a smartphone 900 including a smartphone application for controlling the garage door system 50 (FIG. 25). The smartphone application includes a partitioned user interface 904, where each component/accessory device 200 of the garage door includes a partition of the interface 904. In one example, each partition includes a display 908 for showing the status of the component/accessory device 200 associated with the partition, as well as one or more actuators 912 for controlling the operation of each component/accessory device 200.

In operation, the garage door system 50 is operated by a user via one or more of the peripheral devices 252. A user may remotely actuate the garage door 104 to open or close. Additionally, the user may operate and monitor each accessory device 200 that is plugged into a port 162 of the housing 108 using one or more of the peripheral devices 252 via the operative communication between the electrical mounting interface 400 of each accessory device 200 and each communication interface 166 of the garage door opener 100.

Various features of the invention are set forth in the following claims.

What is claimed is:

1. A modular garage door opener system comprising:
   a garage door opener including a motor that is configured to be coupled to a garage door to open and close the garage door;
   an accessory port disposed on the garage door opener, the accessory port including an accessory mounting interface;
   a first accessory device including a first mounting interface configured to engage the accessory mounting interface to couple the first accessory device to the accessory port; and
   a second accessory device including a second mounting interface configured to engage the accessory mounting interface to couple the second accessory device to the accessory port,
   wherein the first accessory device is a different type of accessory device than the second accessory device.

2. The modular garage door opener system of claim 1, wherein the accessory mounting interface includes a coupling interface and a communication interface having an electrical connector.

3. The modular garage door opener system of claim 2, wherein the first mounting interface further includes a first mechanical mounting interface that engages the coupling interface to mechanically couple the first accessory device to the accessory port, and a first electrical mounting interface that engages the communication interface to electrically couple the first accessory device to the accessory port.

4. The modular garage door opener system of claim 3, wherein the second mounting interface further includes a second mechanical mounting interface that engages the coupling interface to mechanically couple the second accessory device to the accessory port, and a second electrical mounting interface that engages the communication interface to electrically couple the second accessory device to the accessory port.

5. The modular garage door opener system of claim 2, wherein the coupling interface includes an aperture and a retention member.

6. The modular garage door opener system of claim 5, wherein the first mounting interface includes a first hook that is received by the aperture and a first latch that engages the retention member, and the second mounting interface includes a second hook that is received by the aperture and a second latch that engages the retention member.

7. The modular garage door opener system of claim 1, wherein the first accessory device is a speaker, a fan, an extension cord reel, an environmental sensor, a park-assist laser, a light, an inflator, or an inflator cord reel.

8. The modular garage door opener system of claim 7, wherein the second accessory device is a speaker, a fan, an extension cord reel, an environmental sensor, a park-assist laser, a light, an inflator, or an inflator cord reel.

9. The modular garage door opener system of claim 1, further comprising:
   a second accessory port disposed on the garage door opener, the second accessory port including a second accessory mounting interface,
   wherein the first mounting interface is further configured to engage the second accessory mounting interface, and
   wherein the second mounting interface is further configured to engage the second accessory mounting interface.

10. A modular garage door opener system comprising:
    a garage door opener including a motor that is configured to be coupled to a garage door to open and close the garage door;
    a first accessory port disposed on the garage door opener, the first accessory port including a first accessory mounting interface;
    a second accessory port disposed on the garage door opener, the second accessory port including a second accessory mounting interface; and
    an accessory device including a first mounting interface that is configured to engage the first accessory mounting interface to couple the accessory device to the first accessory port, and that is configured to engage the second accessory mounting interface to couple the accessory device to the second accessory port,
    wherein the accessory device further includes a first mounting interface includes an electrical mounting interface and a mechanical mounting interface having a projection and a latch configured to engage the first accessory mounting interface and the second accessory mounting interface.

11. The modular garage door opener system of claim 10, wherein the accessory device is a speaker, a fan, an extension cord reel, an environmental sensor, a park-assist laser, a light, an inflator, or an inflator cord reel.

12. The modular garage door opener system of claim 10, wherein the first accessory mounting interface includes a first coupling interface that is configured to engage the mechanical mounting interface such that the accessory device is mechanically supported on the first coupling interface, and a first communication interface having a first electrical connector that is configured to engage the electrical mounting interface such that the accessory device is electrically coupled to the first communication interface.

13. The modular garage door opener system of claim 12, wherein the second accessory mounting interface includes a second coupling interface that is configured to engage the mechanical mounting interface such that the accessory device is mechanically supported on the second coupling interface, and a second communication interface having a second electrical connector that is configured to engage the electrical mounting interface such that the accessory device is electrically coupled to the second communication interface.

14. The modular garage door opener system of claim 12, wherein the projection includes a hook, and the first coupling interface includes a first aperture that receives the hook and a first retention member that is engaged by the latch.

15. The modular garage door opener system of claim 10, further comprising
a housing of the garage door opener defining a volume in which the motor is received, the housing having a top portion, a bottom portion, and at least one sidewall, wherein the at least one sidewall includes the first accessory port.

16. The modular garage door opener system of claim 15, wherein the at least one sidewall includes the second accessory port.

17. The modular garage door opener system of claim 15, wherein the at least one sidewall includes a first sidewall including the first accessory port, and includes a second sidewall including the second accessory port.

18. The modular garage door opener system of claim 10, further comprising:
a second accessory device including a second mounting interface configured to engage the first accessory mounting interface to couple the second accessory device to the first accessory port, wherein the second mounting interface is further configured to engage the second accessory mounting interface to couple the second accessory device to the second accessory port.

19. A method of operating a modular garage door system comprising:
receiving, by an accessory port of a garage door opener, a first accessory device, wherein receiving the first accessory device includes engaging of a first mounting interface of the first accessory device with an accessory mounting interface of the accessory port;
disengaging, by the accessory port of the garage door opener, from the first accessory device, wherein disengaging the first accessory device includes decoupling of the first mounting interface of the first accessory device from the accessory mounting interface of the accessory port; and
receiving, by the accessory port of the garage door opener, a second accessory device, wherein receiving the second accessory device includes engaging of a second mounting interface of the second accessory device with the accessory mounting interface of the accessory port, wherein the first accessory device is a different type of accessory device than the second accessory device.

20. The method of claim 19, wherein engaging the first mounting interface with the accessory mounting interface includes
coupling a first mechanical mounting interface of the first accessory device to a coupling interface of the accessory mounting interface, and
coupling a first electrical mounting interface of the first accessory device to a communication interface of the accessory mounting interface to electrically couple the first accessory device to the accessory port.

21. The method of claim 20, wherein coupling the first mechanical mounting interface of the first accessory device to the coupling interface further includes receiving a hook of the first mechanical mounting interface with an aperture of the coupling interface, and engaging a latch of the first mechanical mounting interface with a retention member of the coupling interface.

22. The method of claim 19, further comprising:
receiving, by a second accessory port of the garage door opener, the first accessory device, wherein receiving the first accessory device includes engaging of the first mounting interface of the first accessory device with a second accessory mounting interface of the second accessory port.

* * * * *